(12) United States Patent
Hahn

(10) Patent No.: US 10,773,355 B2
(45) Date of Patent: Sep. 15, 2020

(54) METHOD AND DEVICE FOR ANALYZING POLISHING BEHAVIOR IN CMP PROCESS OF SEMICONDUCTOR WAFERS

(71) Applicant: Bong Seok Hahn, Seoul (KR)

(72) Inventor: Bong Seok Hahn, Seoul (KR)

( * ) Notice: Subject to any disclaimer, the term of this patent is extended or adjusted under 35 U.S.C. 154(b) by 239 days.

(21) Appl. No.: 16/061,339

(22) PCT Filed: Sep. 18, 2017

(86) PCT No.: PCT/KR2017/010201
§ 371 (c)(1),
(2) Date: Jun. 11, 2018

(87) PCT Pub. No.: WO2018/207977
PCT Pub. Date: Nov. 15, 2018

(65) Prior Publication Data
US 2019/0375069 A1    Dec. 12, 2019

(30) Foreign Application Priority Data
May 12, 2017 (KR) ........................ 10-2017-0059439

(51) Int. Cl.
*B24B 37/00* (2012.01)
*B24B 37/005* (2012.01)
(Continued)

(52) U.S. Cl.
CPC ............ *B24B 37/005* (2013.01); *G06F 30/20* (2020.01); *H01L 21/30625* (2013.01)

(58) Field of Classification Search
CPC .. B24B 37/005; G06F 30/20; H01L 21/30625
(Continued)

(56) References Cited

U.S. PATENT DOCUMENTS

| 9,108,292 B2* | 8/2015 | Shimano | B24B 53/005 |
| 2004/0015335 A1* | 1/2004 | Kokotov | G05B 17/02 |
| | | | 703/2 |

FOREIGN PATENT DOCUMENTS

| JP | 2009-140956 A | 6/2009 |
| JP | 2009-142973 A | 7/2009 |

(Continued)

OTHER PUBLICATIONS

Kim_2003 (Kinematic Analsys of Chemical Mechanical Polishing and its Effects on Polishing Results, ISSN: 162-9795, vols. 238-239, pp. 229-234 online: Apr. 15, 2003) (Year: 2003).*

(Continued)

*Primary Examiner* — Brian S Cook
(74) *Attorney, Agent, or Firm* — Park, Kim & Suh, LLC

(57) ABSTRACT

Disclosed herein are a method for analyzing polishing behavior and a device for the same. Herein, the method corresponds to a method for analyzing polishing behavior of a device for analyzing polishing behavior by at least one processor including the steps of setting up equipment shape variables, operation variables, and calculation variables corresponding to at least one configuration element being selected from one of a pad and a wafer, the pad and the wafer configuring a polishing device, generating calculation nodes based on the equipment shape variables, the operation variables, and the calculation variables, calculating a sliding distance on a wafer surface caused by the pad or a sliding distance on a pad surface caused by the wafer by using the calculation node, and outputting the calculated result.

16 Claims, 40 Drawing Sheets

(51) Int. Cl.
  *G06F 30/20* (2020.01)
  *H01L 21/306* (2006.01)
(58) Field of Classification Search
  USPC .............................................. 703/6
  See application file for complete search history.

(56) References Cited

FOREIGN PATENT DOCUMENTS

| | | |
|---|---|---|
| JP | 2009-246024 A | 10/2009 |
| JP | 2012-074574 A | 4/2012 |
| JP | 2013-118404 A | 6/2013 |
| JP | 2014-161938 A | 9/2014 |
| JP | 2015-211133 A | 11/2015 |

OTHER PUBLICATIONS

Akira_2012 (Influence of Wafer Edge Geometry on Removal Rates Profile in Chemical Mechanical Polishing: Wafer Edge Roll-Off and Notch, Japanese Journal of Applied Physics, vol. 51, Issue 5S, article id. 05EF01 (2012)). (Year: 2012).*
International Search Report in International Application No. PCT/KR2017/010201, dated Feb. 2, 2018.

* cited by examiner

Enlargement view for calculation node distribution of wafer(wafer notch area)

P 1 – Initial position of pad node
P 2 – Position after unit time movement of pad node

METHOD AND DEVICE FOR ANALYZING POLISHING BEHAVIOR IN CMP PROCESS OF SEMICONDUCTOR WAFERS

CROSS-REFERENCE TO RELATED APPLICATIONS

This application is the National Stage filing under 35 U.S.C. 371 of International Application No. PCT/KR2017/010201, filed on Sep. 18, 2017, which claims the benefits of Korean Patent Application No. 10-2017-0059439, filed on May 12, 2017, the contents of which are all hereby incorporated by reference herein in their entirety.

BACKGROUND OF THE INVENTION

Field of the Invention

The present invention relates to a method and device for simulating and analyzing polishing behavior occurring due to interaction between elements configuring a wafer polishing device in a semiconductor wafer CMP process.

Discussion of the Related Art

In the related art, in order to perform analysis or result prediction on wafer polishing in a CMP process, it was actually possible to detect and analyze a level of abrasion loss (or level of abrasion) of a pad, or a level of wafer polishing by attaching a laser measurement device or sensor. However, in the related art, it was difficult to directly calculate the polishing result based on mutual sliding behaviors between a pad, which adopts a geometric shape of a polishing device, and a wafer.

SUMMARY OF THE INVENTION

Technical Problem

Accordingly, the present invention is directed to a method and device for analyzing polishing behavior in a CMP process of semiconductor wafers that substantially obviate one or more problems due to limitations and disadvantages of the related art. A technical object of the present invention is to provide a method and device for analyzing polishing behavior in order to discover optimal conditions for performing the semiconductor wafer CMP process.

Technical Solution

To achieve these objects and other advantages and in accordance with the purpose of the invention, as embodied and broadly described herein, according to an exemplary embodiment of the present invention, provided herein is a method for analyzing polishing behavior of a device for analyzing polishing behavior by at least one processor including the steps of setting up equipment shape variables, operation variables, and calculation variables corresponding to at least one configuration element being selected from one of a pad and a wafer, the pad and the wafer configuring a polishing device, generating calculation nodes based on the equipment shape variables, the operation variables, and the calculation variables, calculating a sliding distance on a wafer surface caused by the pad or a sliding distance on a pad surface caused by the wafer by using the calculation node, and outputting the calculated result.

Preferably, the step of calculating a sliding distance may include the steps of calculating each of fixed coordinates corresponding to coordinates before an elapse of accumulated time and node movement coordinates corresponding to coordinates after the accumulated time of a first calculation node, the first calculation node being selected from a plurality of nodes corresponding to a first configuration element among the selected configuration elements, determining whether or not a boundary of a second configuration element among the selected configuration elements exists in a position between the fixed coordinates and the node movement coordinates, if the boundary does not exist, calculating a distance travelled by the first calculation node between the fixed coordinates and the node movement coordinates, thereby computing the calculated travel distance as a sliding distance of the first calculation node, and, if the boundary exists, computing a travel distance corresponding to an inner part of a second configuration element between the fixed coordinates and the node movement coordinates that are divided by the boundary, as a sliding distance of the first calculation node.

Preferably, the sliding distance may be accumulated for each of a unit time, a plurality of calculation nodes, and a sliding angle, respectively.

Preferably, the sliding distance may be calculated while considering pad groove patterns and a wafer flat or notch, respectively.

Preferably, after the step of calculating a sliding distance, the method may further include the step of storing the sliding distance and movement angles indicating polishing directions as accumulated data for each of the calculation nodes.

Preferably, in the step of outputting the calculated result, a sliding distance distribution image, changes in a sliding speed, and trajectory results of calculation nodes of the pad or wafer configuring the polishing device may be provided in forms of numeric data, images or moving picture images.

Preferably, in the step of outputting the calculated results, a graph may be outputted, wherein the graph indicates a polishing direction having a longest sliding distance in vector data corresponding to each of the calculation nodes in forms of numeric data or vector.

Preferably, in the step of outputting the calculated results, the sliding distance for each vector may be indicated in the vector data corresponding to each of the calculation nodes by using numeric data or color indicators.

Preferably, in the step of setting up equipment shape variables, operation variables, and calculation variables corresponding to at least one configuration element being selected from a pad or a wafer, the pad and the wafer configuring a polishing device, equipment shape variables, operation variables, and calculation variables corresponding to a head may be additionally configured. Herein, the sliding distance may be calculated by using the additionally configured variables.

Preferably, in the step of setting up equipment shape variables, operation variables, and calculation variables corresponding to at least one configuration element being selected from a pad or a wafer, the pad and the wafer configuring a polishing device, equipment shape variables, operation variables, and calculation variables corresponding to a conditioner may be additionally configured. Herein, a sliding distance of a conditioner caused by the pad or a sliding distance of a pad caused by the conditioner may be calculated accordingly by using the calculation nodes.

Preferably, in addition to the sliding distance, an item being calculated by using the calculation nodes may be selected from at least one of an effective sliding distance and an accumulated movement vector.

Additionally, provided herein is a device for analyzing polishing behavior including a memory storing a polishing behavior analysis program, wherein the polishing behavior analysis program is configured to provide a screen to a user allowing the user to input and/or to set up information on variables for analyzing polishing behavior, to analyze polishing behavior when a polishing device polishes a polishing target by using the information on the variables being inputted and/or set up by the user, and to output an analysis result, and a processor executing the polishing behavior analysis program, wherein the polishing behavior analysis program may include instructions for setting up equipment shape variables, operation variables, and calculation variables corresponding to at least one configuration element being selected from one of a pad and a wafer, the pad and the wafer configuring a polishing device, for generating calculation nodes based on the equipment shape variables, the operation variables, and the calculation variables, and for outputting results of calculating a sliding distance on a wafer surface caused by the pad or a sliding distance on a pad surface caused by the wafer by using the calculation node.

Preferably, the polishing behavior analysis program may include instructions for calculating each of fixed coordinates corresponding to coordinates before an elapse of accumulated time and node movement coordinates corresponding to coordinates after the accumulated time of a first calculation node, the first calculation node being selected from a plurality of nodes corresponding to a first configuration element among the selected configuration elements, and for determining whether or not a boundary of a second configuration element among the selected configuration elements exists in a position between the fixed coordinates and the node movement coordinates. And, if the boundary does not exist, the polishing behavior analysis program may include instructions for calculating a distance travelled by the first calculation node between the fixed coordinates and the node movement coordinates, thereby computing the calculated travel distance as a sliding distance of the first calculation node, and, if the boundary exists, the polishing behavior analysis program includes instructions for computing a travel distance corresponding to an inner part of a second configuration element between the fixed coordinates and the node movement coordinates that are divided by the boundary as a sliding distance of the first calculation node.

Preferably, the polishing behavior analysis program may generate data accumulating the sliding distance being calculated for each of a unit time, a plurality of calculation nodes, and a sliding angle, respectively, while considering pad groove patterns and a wafer flat or notch, respectively.

Preferably, the polishing behavior analysis program may output at least one of a graph indicating numeric data of calculated sliding distances, changes in a sliding speed according to a time axis, trajectory results of calculation nodes corresponding to each of the pads and the wafers configuring the polishing device, and a direction having a longest sliding distance in vector data corresponding to each calculation node as a vector, and a graph differentiating the sliding distance for each vector in the vector data corresponding to each of the calculation nodes by using different colors, and indicating such differentiation.

Preferably, equipment shape variables, operation variables, and calculation variables corresponding to a head may be additionally configured, wherein the head may correspond to a configuration element configuring the polishing device. Herein, calculation nodes may be generated based on the equipment shape variables, the operation variables, and the calculation variables.

Preferably, equipment shape variables, operation variables, and calculation variables corresponding to a conditioner may be additionally configured, wherein the conditioner corresponds to a configuration element configuring the polishing device. Herein, calculation nodes may be generated based on the equipment shape variables, the operation variables, and the calculation variables.

Preferably, at least one of an effective sliding distance and an accumulated movement vector may be selected and further calculated, in addition to a sliding distance of a wafer surface caused by the pad or a sliding distance of a pad surface caused by the wafer.

Effect of the Invention

As described above, the method and device for analyzing polishing behavior in a CMP process of semiconductor wafers have the following advantages. According to the exemplary embodiment of the present invention, by analyzing relative polishing behaviors between a wafer, which is a target of polishing, and a polishing pad, and so on, in a polishing device for polishing semiconductor wafers, optimal conditions for an efficient process, such as uniform polishing of the wafer, uniform abrasion of the pad, and so on, may be discovered.

BRIEF DESCRIPTION OF THE DRAWINGS

FIG. 30b illustrates an enlarged image of a sliding distance distribution of chip die Number 29 indicated in FIG. 29 and FIG. 30a.

DETAILED DESCRIPTION OF THE INVENTION

Figure 1:
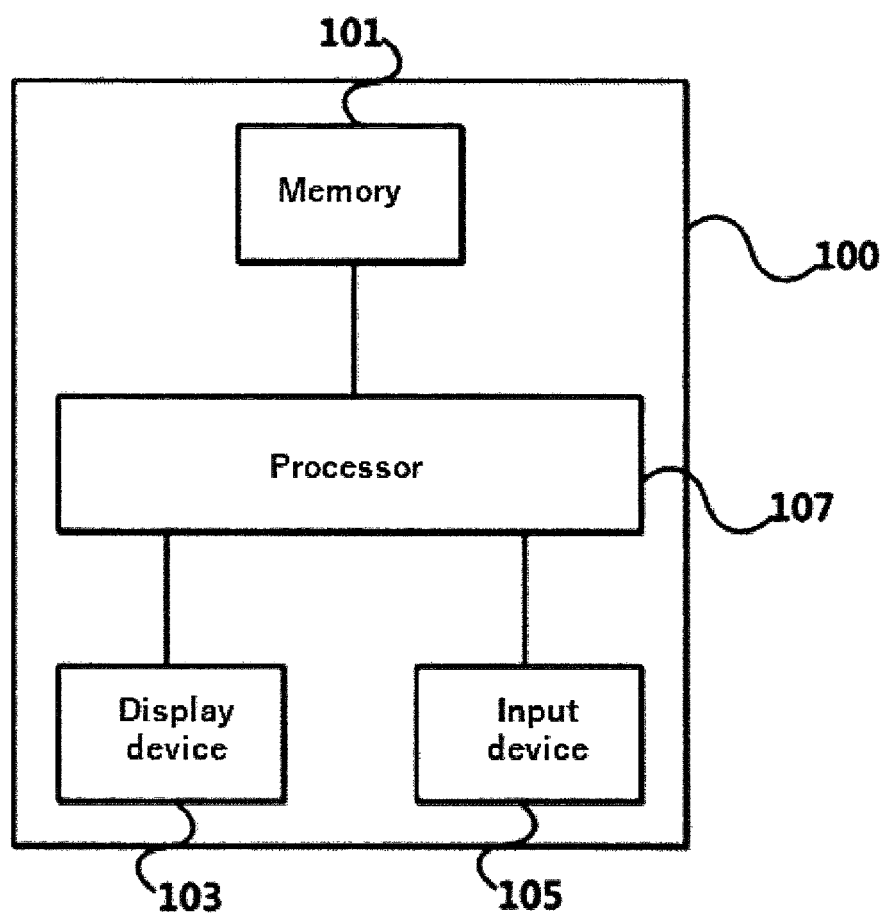
FIG. 1 illustrates a block diagram showing hardware configuration of a device for analyzing polishing behavior according to an exemplary embodiment of the present invention.

Hereinafter, the exemplary embodiments of the present invention will be described in detail with reference to the accompanying drawings. However, the scope of the claims of the present invention will not be limited only to the exemplary embodiments presented herein. Wherever possible, the same reference numerals will be used throughout the drawings to refer to the same or like parts. Within the drawings, the same reference numerals will be used for identical elements in different drawings.

Moreover, in providing the detailed description of the present invention with reference to the accompanying drawings, the same reference numerals used for identical elements regardless of the reference numbers corresponding to the accompanying drawings. Accordingly, a detailed description of such identical elements will be omitted for simplicity. In describing the present invention, when it is determined that the detailed description on a related disclosed technology may cause ambiguity in the concept (or idea) of the present invention, the detailed description of the same will be omitted for simplicity.

Through the entire specification of the present invention, when a particular part is said to "include" a particular element, this indicates that, unless specified otherwise, the corresponding part may further include another element (or other elements), and, therefore, this does not indicate that the corresponding part excludes the other element(s). Additionally, terms indicated as " . . . unit", " . . . part", " . . . device", " . . . module", and so on, indicates a unit executing or processing at least one function or operation, and such parts may be implemented in the form of hardware or software, or in the form of a combination of both hardware and software.

In the description of the present invention, the term "fixed coordinates" refers to coordinates before calculation or coordinates located at a start point.

Furthermore, in the specification of the present invention, calculations of a sliding distance of a wafer caused by a pad and/or a sliding distance of a pad caused by a wafer will hereinafter be set as a basic and essential calculation item.

Before describing the present invention in detail, the significance of the present invention will first be briefly described as presented below.

As a method for calculating physical quantity according to the conventional numerical analysis, just as a finite element method (FEM), a method of configuring the shapes (or forms) of analysis objects (or calculation objects) as finite and interconnected nodes and calculating changes in the physical quantity due to external influences by using a relationship equation between the generated nodes, is generally used. In case the subject is a solid material, the main physical quantities that are calculated correspond to changes in temperature, stress, strain, and so on, which are caused by external sources, thermal energy, pressure, and so on. However, since physical quantities, such as relative sliding distances between a pad and a wafer, are not considered in the conventional numerical analysis methods, such as FEM, such physical quantities cannot be calculated by using conventional numerical analysis software. According to the present invention, in order to calculate the sliding distance, instead of using the conventional numerical analysis method, which perform calculation in association with the physical quantity of the entire analysis object (or calculation object), a method of generating independent calculation nodes based on the shapes (or forms) of the analysis objects and calculating independent physical quantities for each node by using the generated calculation nodes is used. Additionally, the calculation method according to the present invention is optimized for more quickly calculating physical quantities, such as a change in relative sliding positions between two objects, an accumulated sliding distance, direction, and so on, of each node. And, the calculation results, which consist of the shapes (or forms) and structures of the analysis objects have been devised to be applied in other numerical analysis methods and easily used for calculating other physical quantities.

Hereinafter, the method and device for analyzing polishing behavior according to the exemplary embodiment of the present invention will be described in detail.

Herein, when a polishing device, which is used in a chemical mechanical planarization (CMP) process for polishing semiconductor wafers, polishes a wafer, which is a polishing target, by simulating a polishing result in advance, the method for analyzing polishing behavior allows an optimal condition for performing uniform polishing to be discovered. Most particularly, the polishing behavior is analyzed based on diverse static variables and dynamic variables belonging to the polishing device. And, herein, the polishing result is analyzed by using a relative sliding distance of the polishing target, which is generated during the polishing process, along with an accumulated vector, which is used for considering a polishing direction, and a state of abrasion is also analyzed.

The above-described polishing device includes a head, one or more wafers, pad, and conditioner. Operations performed by the polishing device will hereinafter be broadly described. Firstly, a wafer is installed to the head, and the wafer is polished by having the wafer perform rubbing motions on the pad. While the polishing process is being carried out, the conditioner recovers a polishing surface of the pad. At this point, grooves may be formed on the pad in order to further enhance polishing efficiency. Herein, the groove may have diverse forms and dimensions, such as texture, width, and so on. During the polishing process, the pad performs a rotating movement, and the head may perform a circular rotating movement while performing sweep movements moving sideways (i.e., left-to-right, or vice versa). This to perform uniform polishing on the wafer surface and to perform a uniform usage of the polishing surface of the pad. Pressure may be applied to the above described head whenever required. And, when pressure is applied, the polishing may be accelerated on an area of the wafer where the pressure is applied.

Each wafer may have a different diameter, and one or more wafers may be polished. Each wafer may also be configured to have a flat or a notch formed thereon. A flat refers to a shape that is formed by evenly cutting out a portion of the circular wafer. And, a notch refers to a wedge type groove that is formed on the wafer.

The polishing surface of the pad should be entirely uniform. And, in order to facilitate the polishing process, a polishing liquid, which is configured of a type of liquid having an abrasive material dispersed therein, is sprayed on the polishing surface when performing the polishing process.

As the polishing time is extended, or as the polishing session is repeated and performed several times, deformation may occur in the polishing surface. In order to allow such deformed pad to return to its initial state (or condition) as much as possible, a conditioner is installed by default in the polishing device. At this point, grooves may be formed on the conditioner in order to further enhance efficiency in the pad condition recovery process. Herein, the groove may have diverse forms, and dimensions, such as texture, width, and so on.

The device for analyzing the polishing behavior of the above-described polishing device is configured as shown in FIG. 1. Herein, FIG. 1 illustrates a block diagram showing hardware configuration of a polishing behavior analysis device according to an exemplary embodiment of the present invention.

Referring to FIG. 1, a polishing behavior analysis device 100 includes a memory 101, a display device 103, an input device 105, and at least one processor 107. The processor 107 is connected to the display device 103, which is implemented as a monitor, and the processor 107 is also connected to the input device 105, which includes a mouse, a keyboard, and so on. The polishing behavior analysis device 100 provides a screen to a user through the display device 103. The screen allows the user to input and/or set-up information on variables for analyzing the polishing behavior. Thereafter, the polishing behavior analysis device 100 uses the information that is inputted and/or set-up by the user on the screen through the display device 103 and analyzes the polishing behavior, when the polishing device polishes the polishing target. Afterwards, the polishing behavior analysis device 100 outputs the analysis result through the display device 103.

The processor 107 may be implemented as a central processing unit (CPU), or another chip set, or as a microprocessor, and so on. The memory 101 is connected to the processor 107 and stores a polishing behavior analysis program, which includes instructions, and so on, for performing polishing behavior analysis. The processor 107 executes the polishing behavior analysis program, which is stored in the memory 101. And, a series of processing steps of the polishing behavior analysis program is as shown below in FIG. 2.

Figure 2:
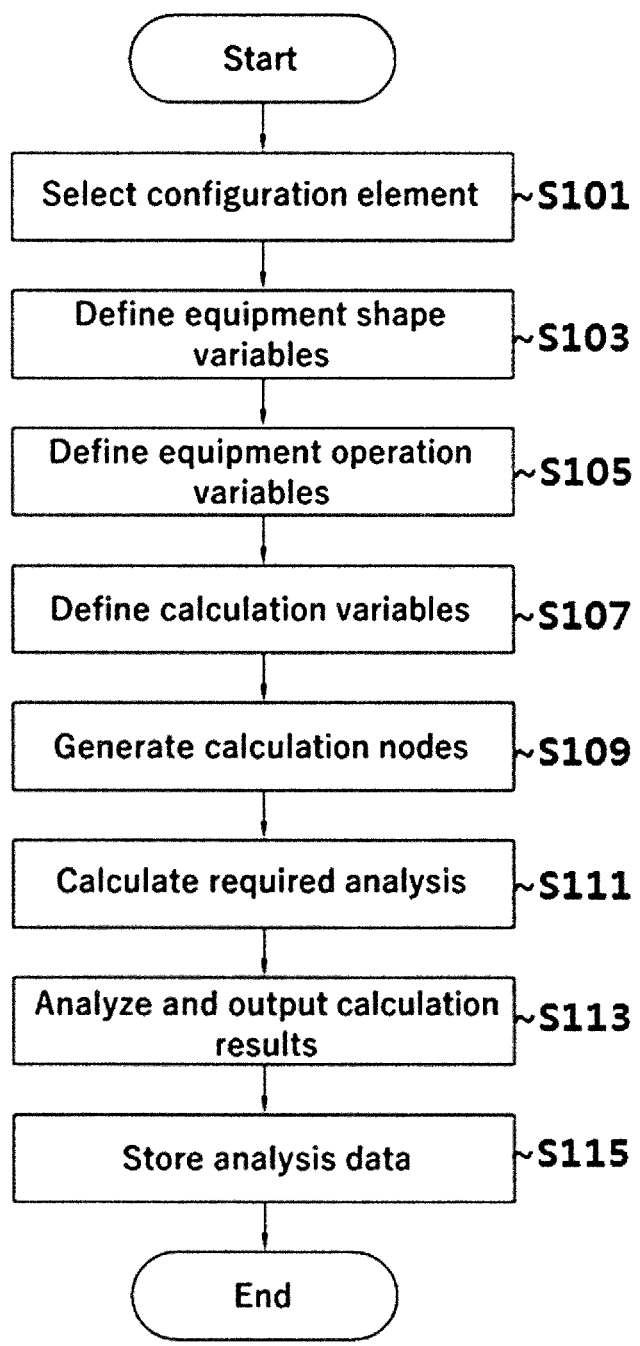
FIG. 2 illustrates a flow chart showing a polishing behavior analysis method according to an exemplary embodiment of the present invention.
Figure 3A:
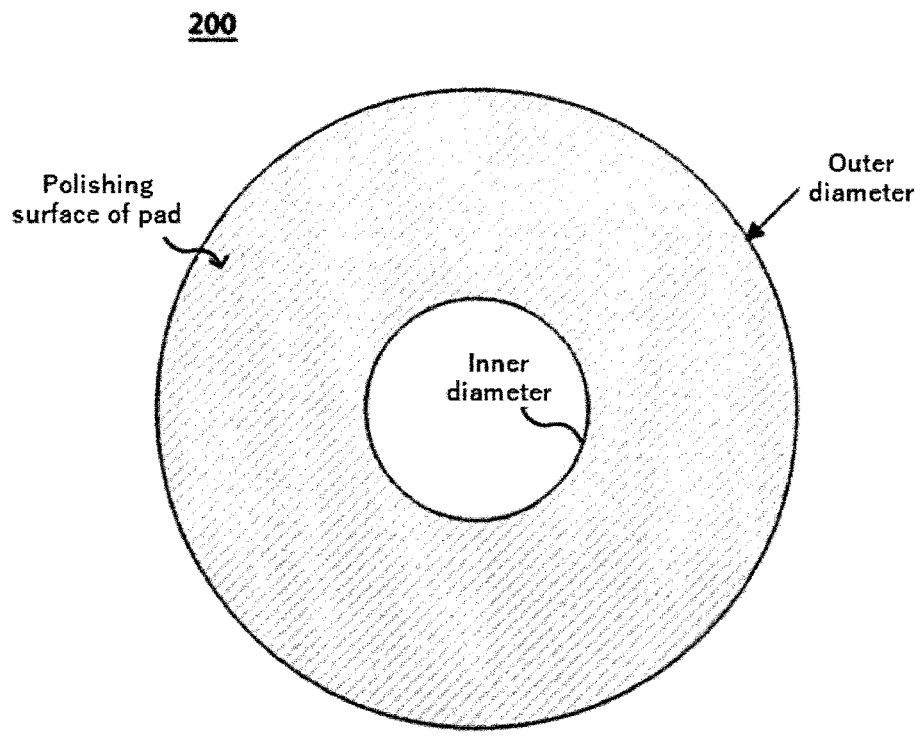
FIG. 3a illustrates a ring type (doughnut type) pad according to an exemplary embodiment of the present invention.
Figure 3B:
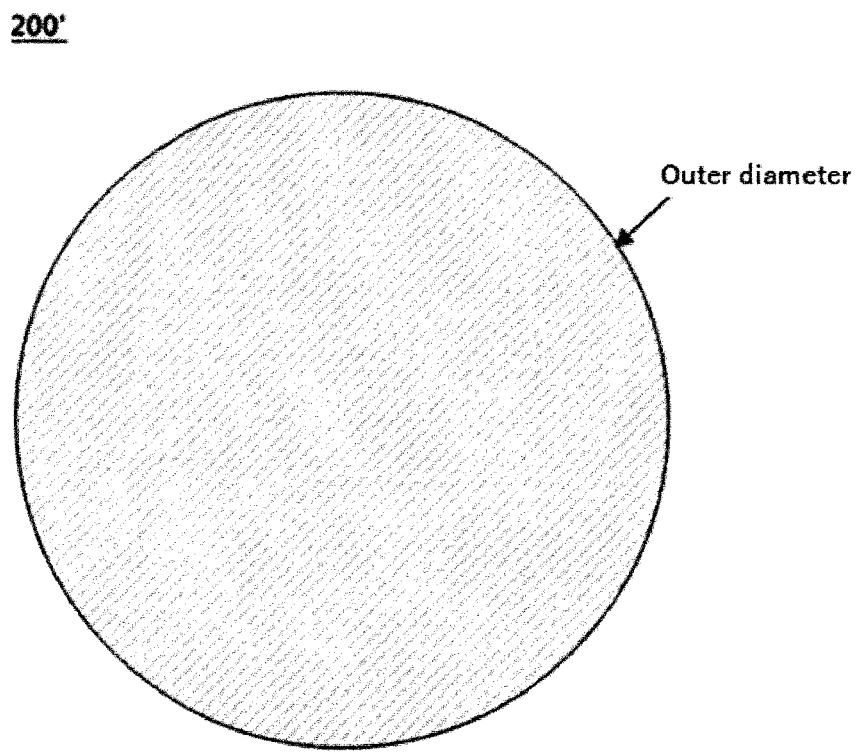
FIG. 3b illustrates a disc type circular pad according to an exemplary embodiment of the present invention.
Figure 4:
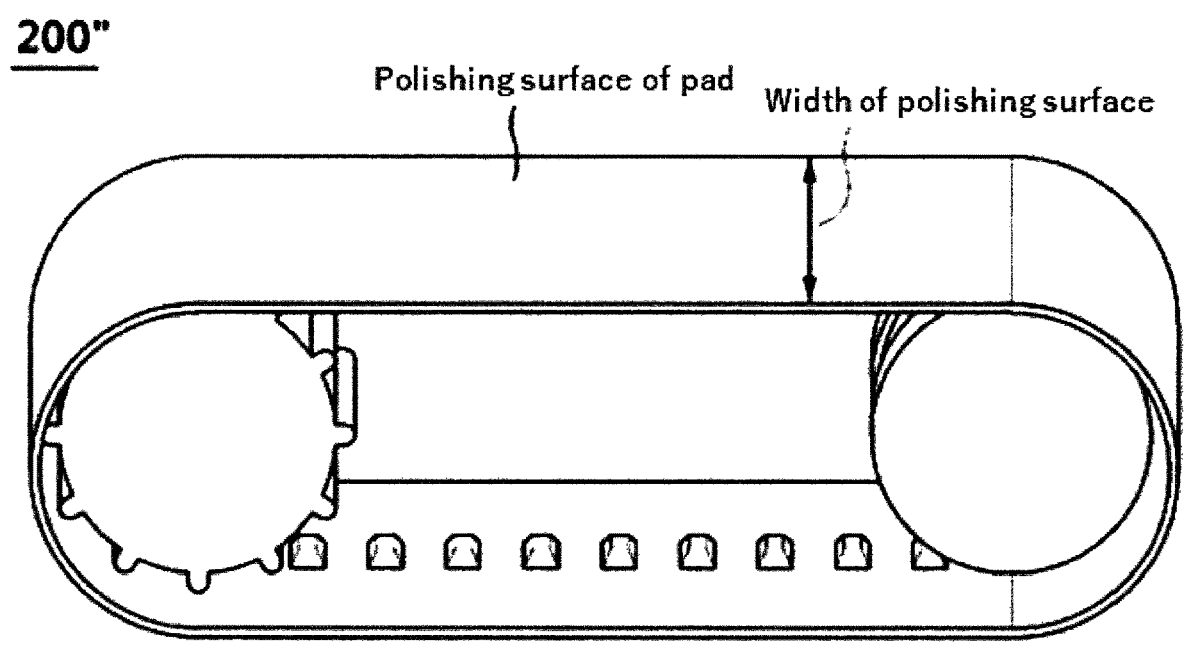
FIG. 4 illustrates a belt type pad according to an exemplary embodiment of the present invention.
Figure 5:
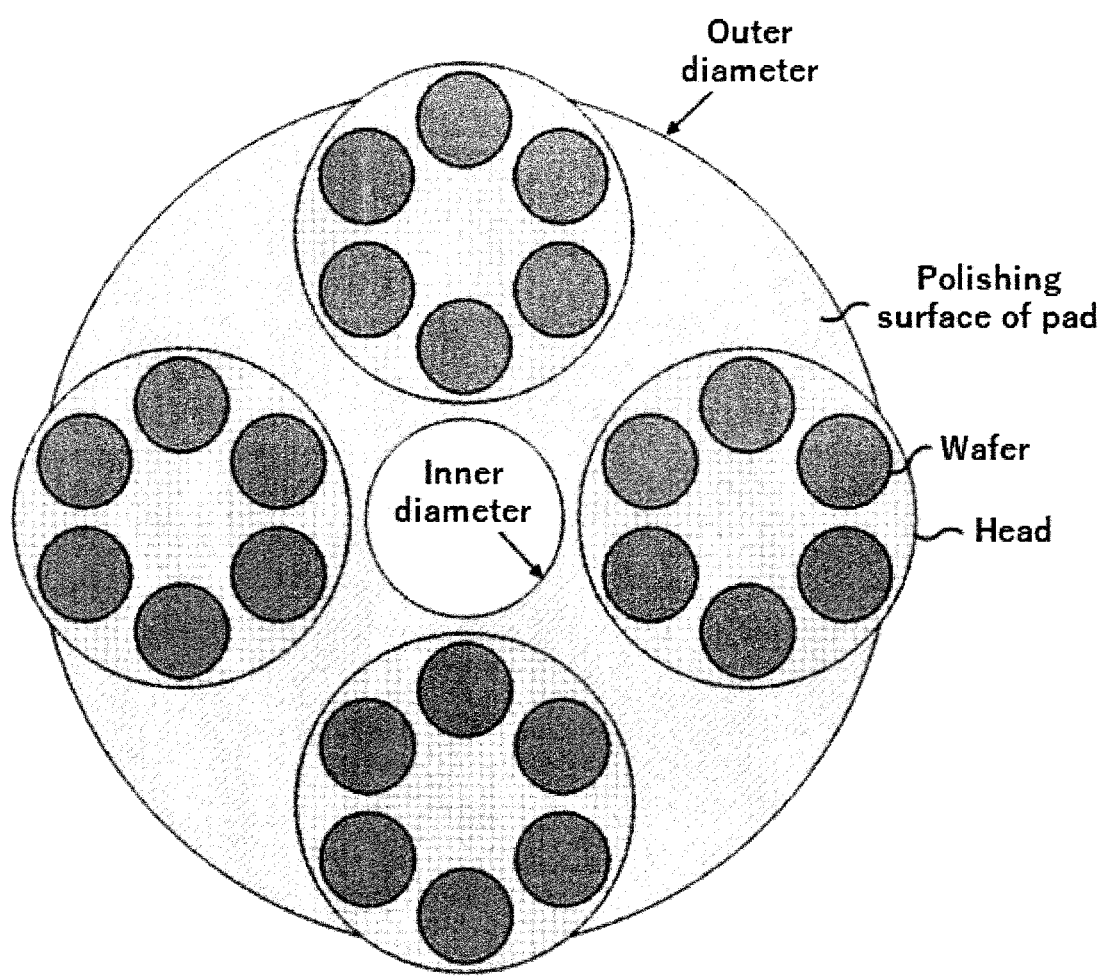
FIG. 5 illustrates an example of installing a pad and a head according to an exemplary embodiment of the present invention.
Figure 6A:
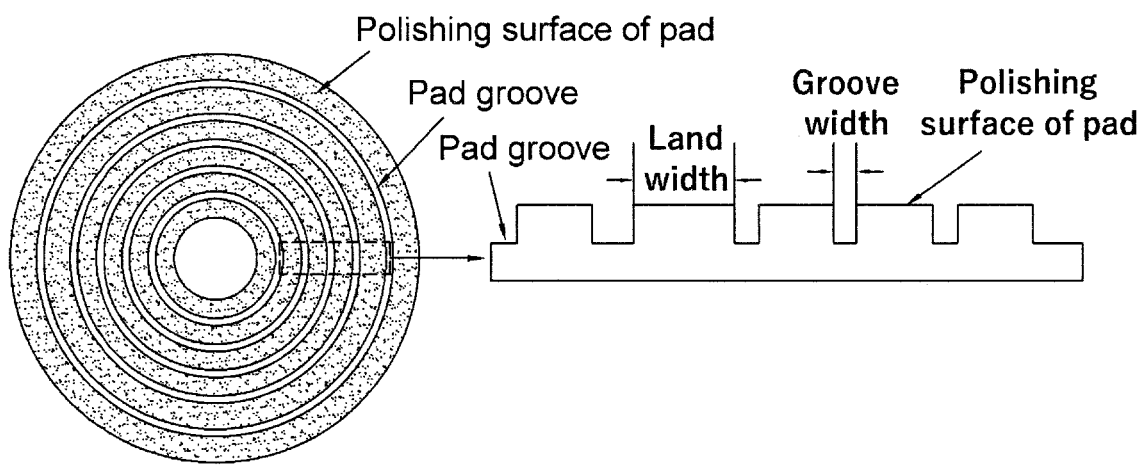
FIG. 6a illustrates a form of groove patterns according to an exemplary embodiment of the present invention.
Figure 6B:
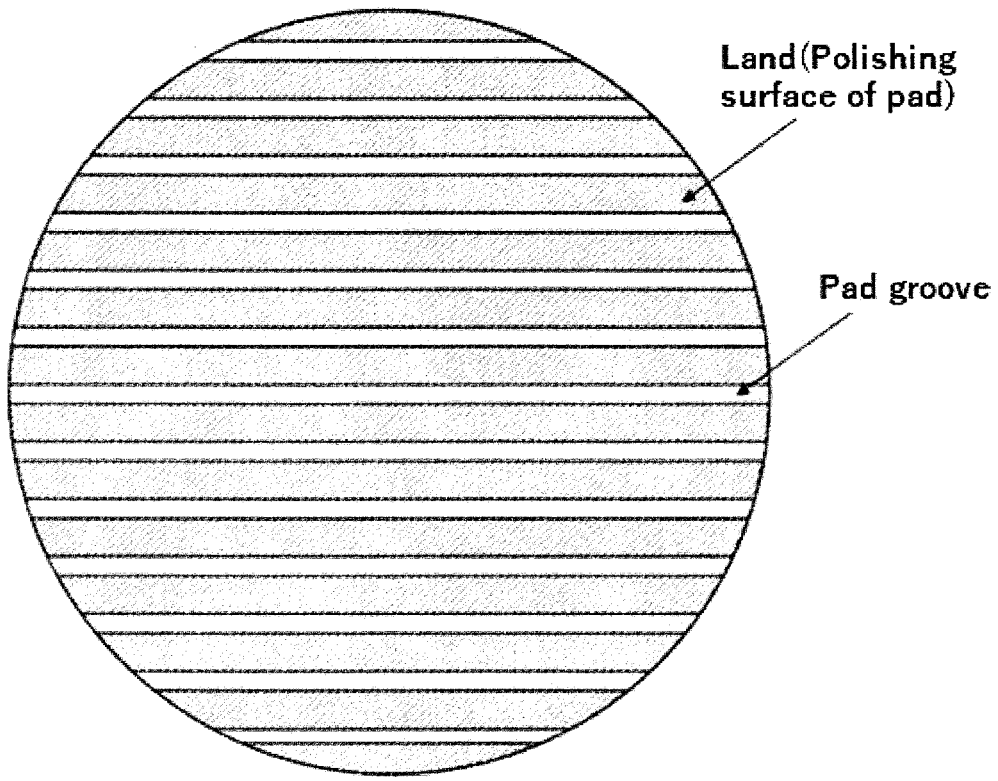
FIG. 6b illustrates a form of groove patterns according to another exemplary embodiment of the present invention.
Figure 6C:
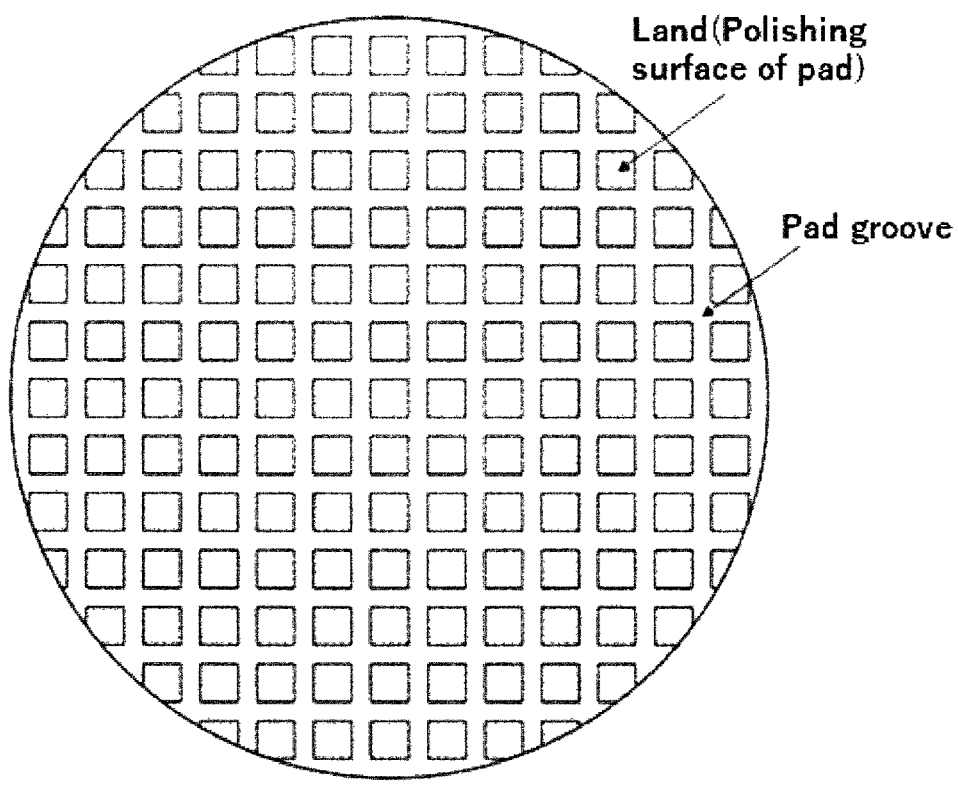
FIG. 6c illustrates a form of groove patterns according to yet another exemplary embodiment of the present invention.
Figure 7:
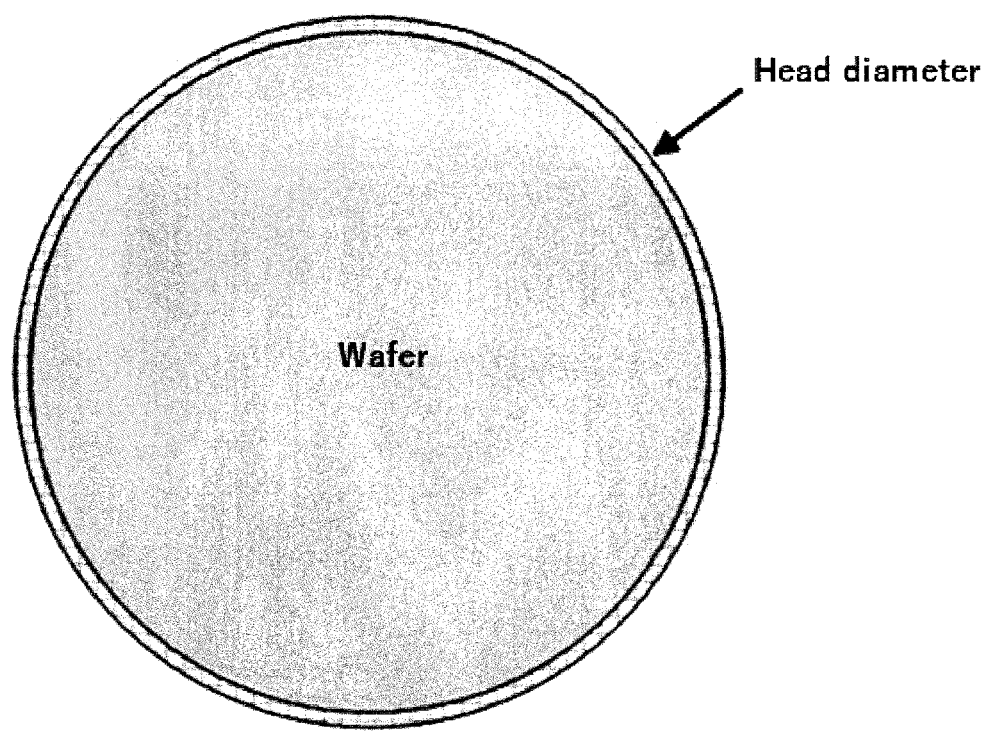
FIG. 7 illustrates an example of installing a wafer on a head according to an exemplary embodiment of the present invention.
Figure 8A:
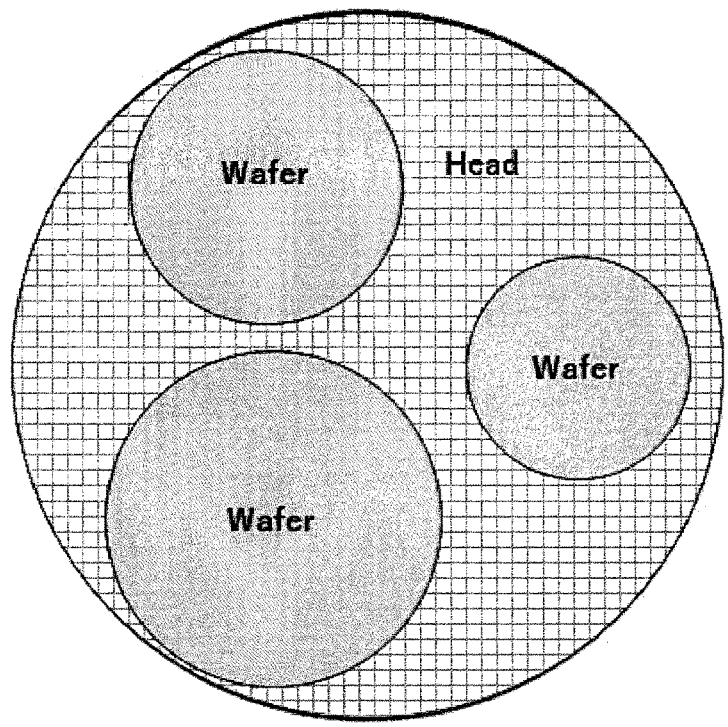
FIG. 8a illustrates an example of installing multiple wafers on a head according to another exemplary embodiment of the present invention.
Figure 8B:
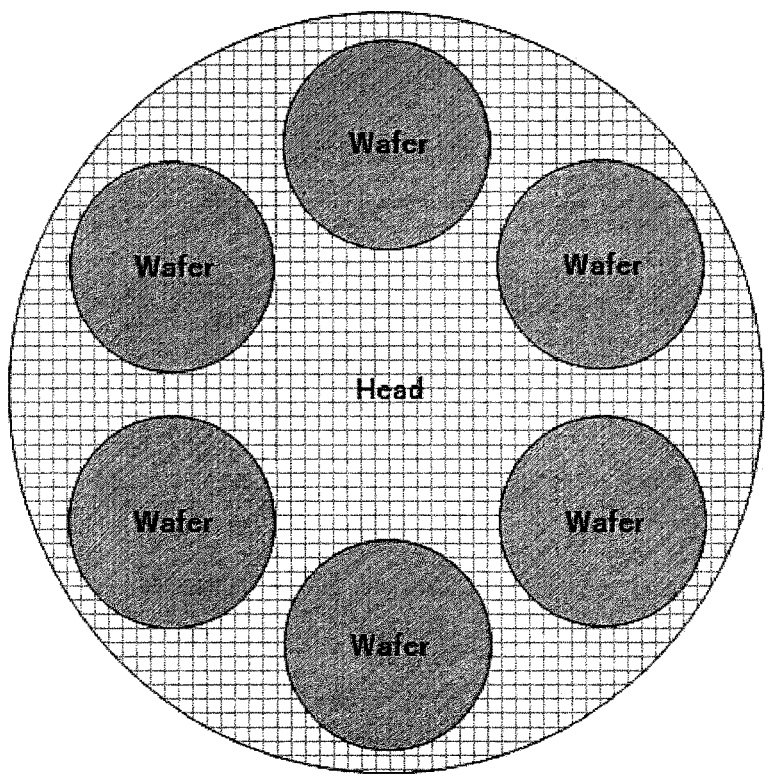
FIG. 8b illustrates an example of installing multiple wafers on a head according to yet another exemplary embodiment of the present invention.
Figure 9:
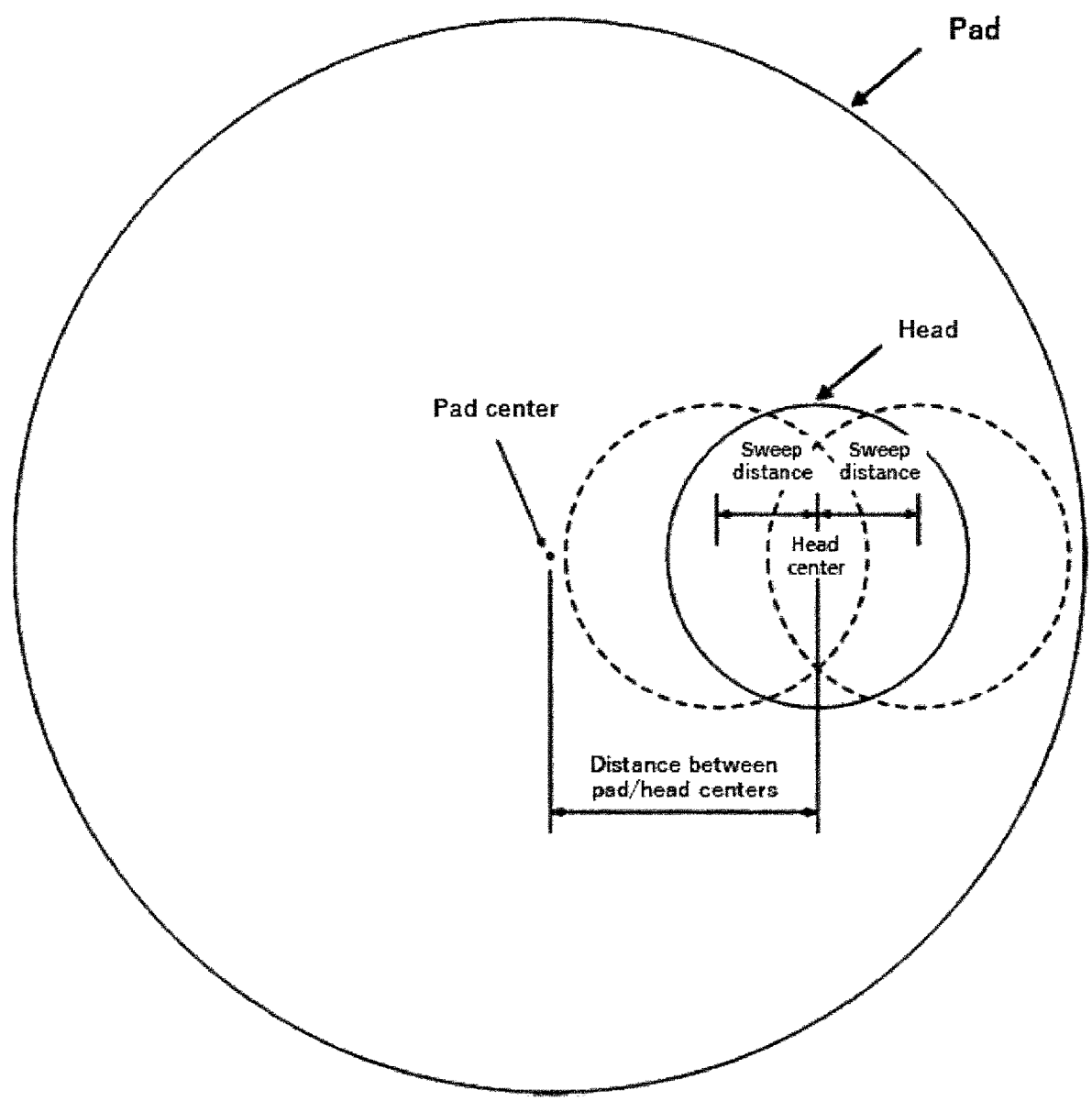
FIG. 9 illustrates an example of determining a head position by linear sweep according to an exemplary embodiment of the present invention.
Figure 10:
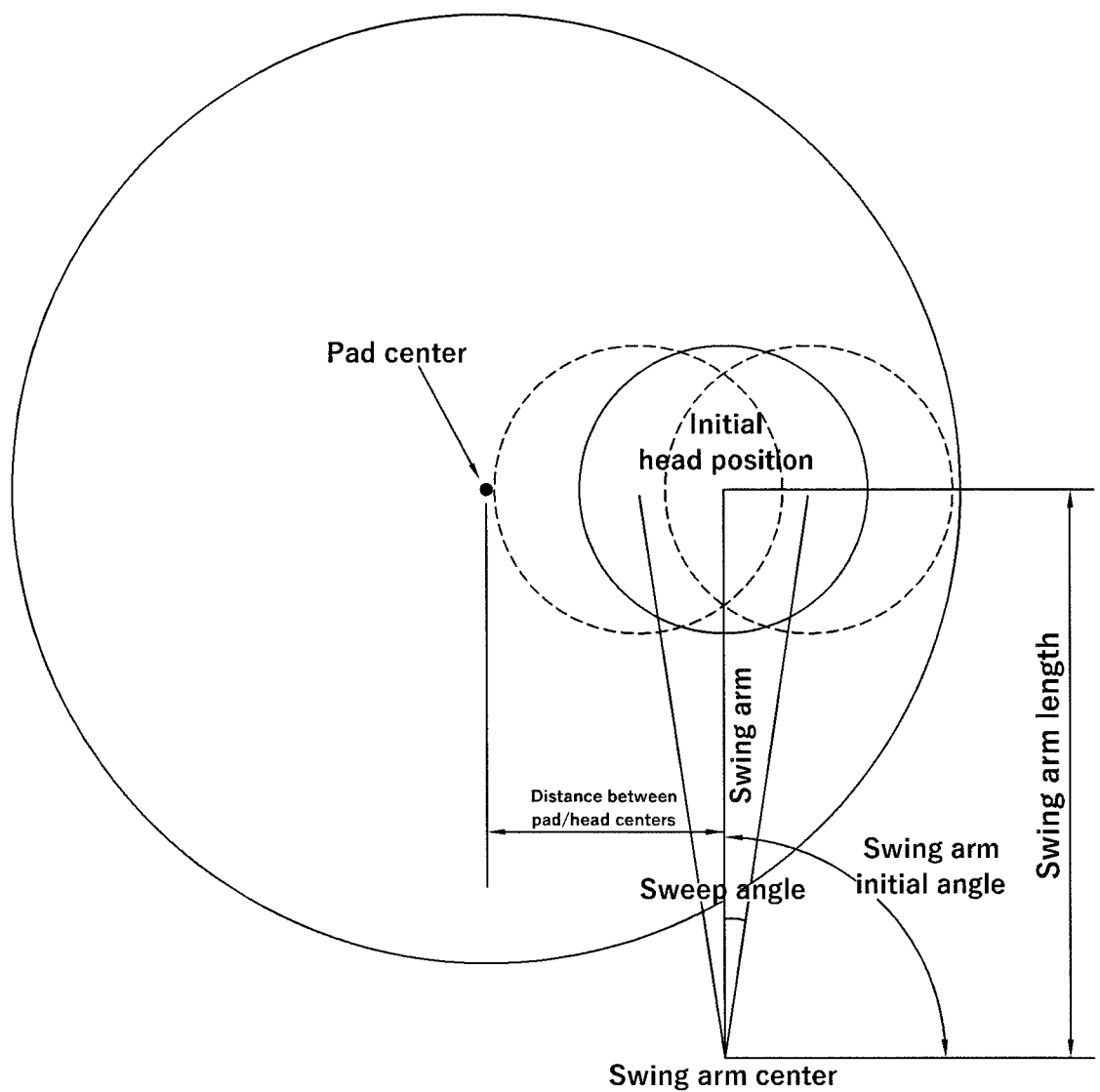
FIG. 10 illustrates an example of determining a head position by swing arm sweep according to an exemplary embodiment of the present invention.
Figure 11:
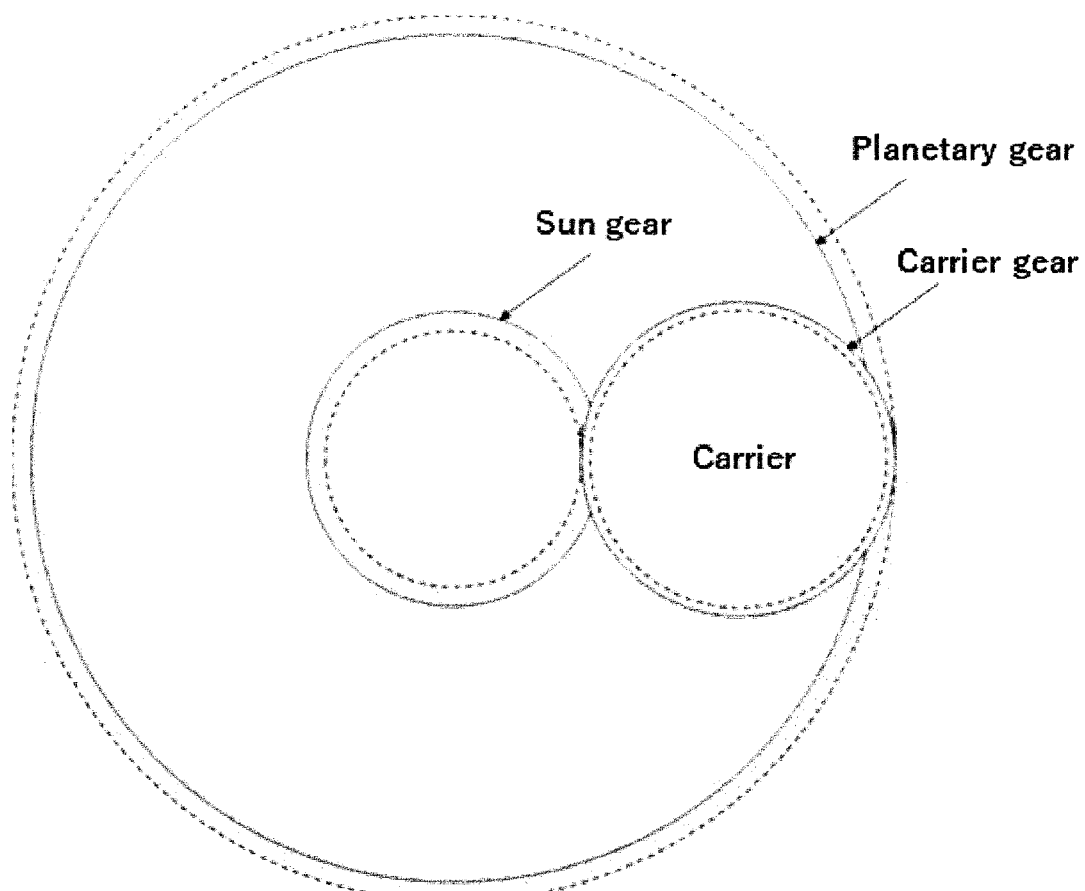
FIG. 11 illustrates equipment shape variables of a planetary gear head according to an exemplary embodiment of the present invention.
Figure 12:
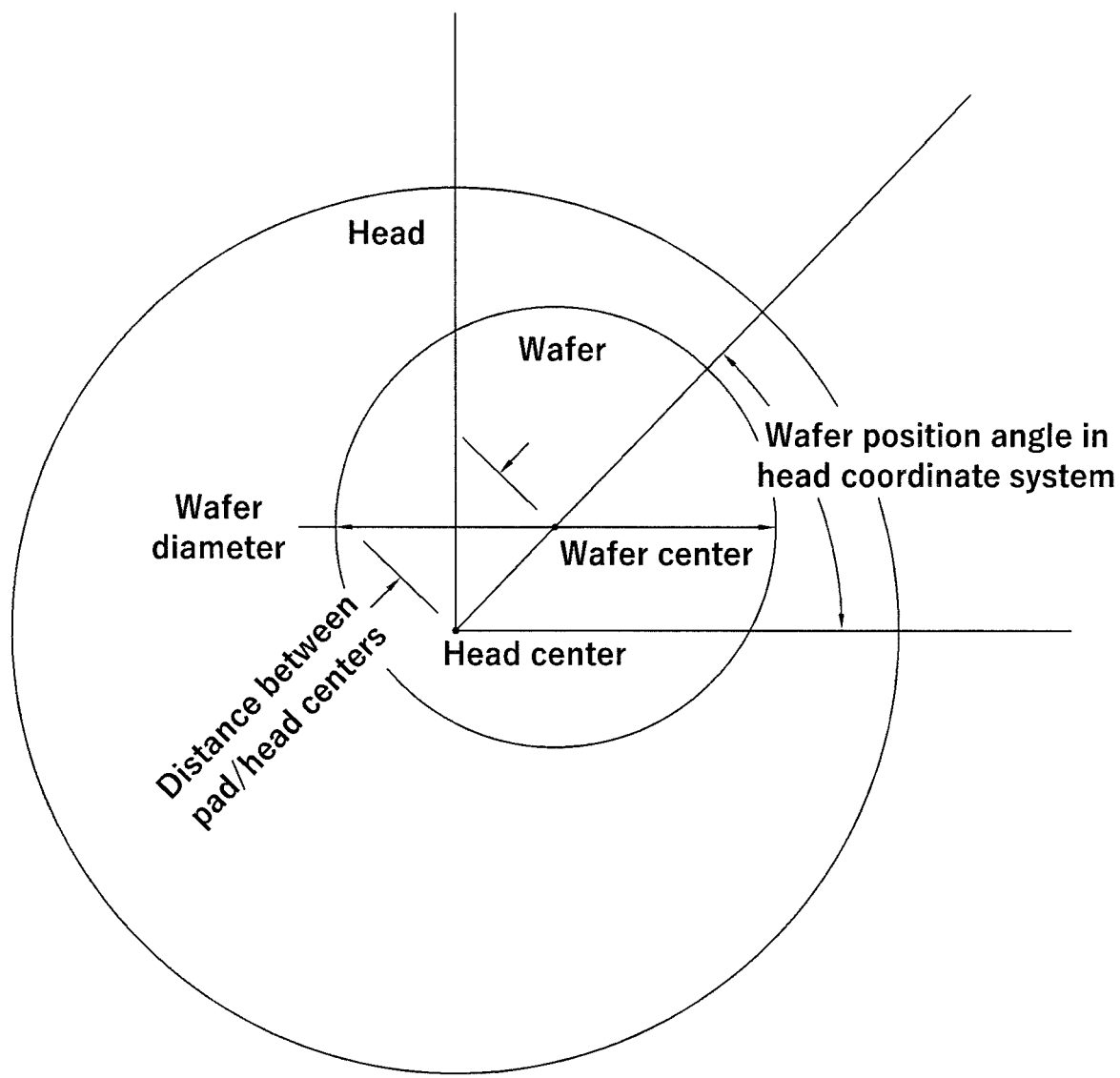
FIG. 12 illustrates equipment shape variables of wafer coordinates according to an exemplary embodiment of the present invention.
Figure 13:
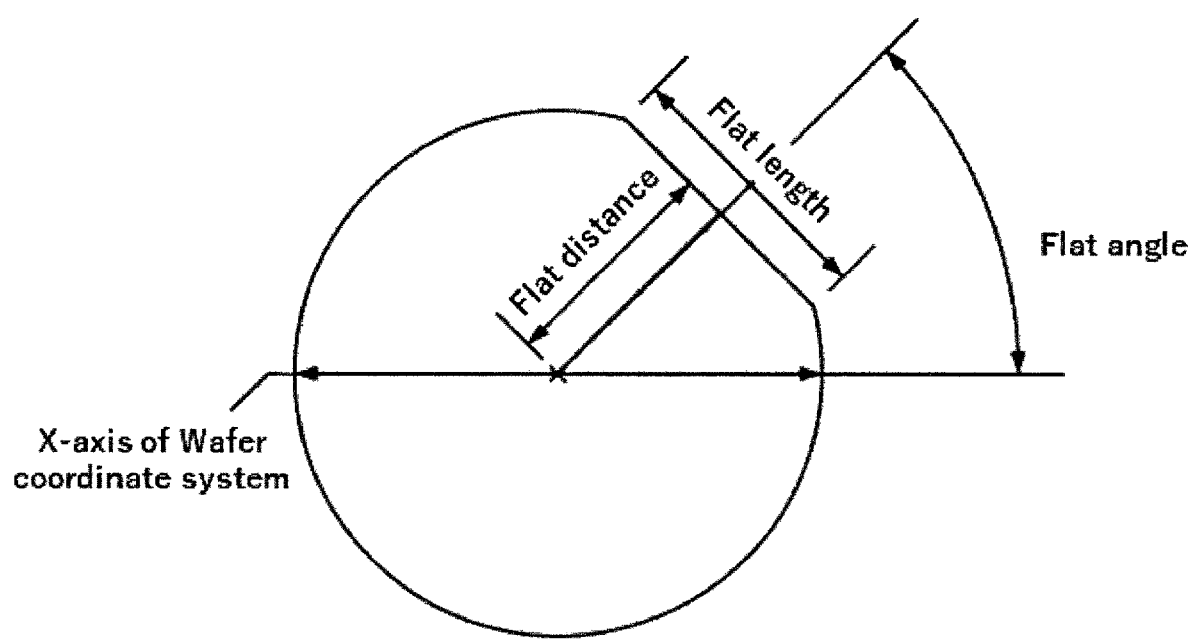
FIG. 13 illustrates equipment shape variables of a wafer flat according to an exemplary embodiment of the present invention.
Figure 14A:
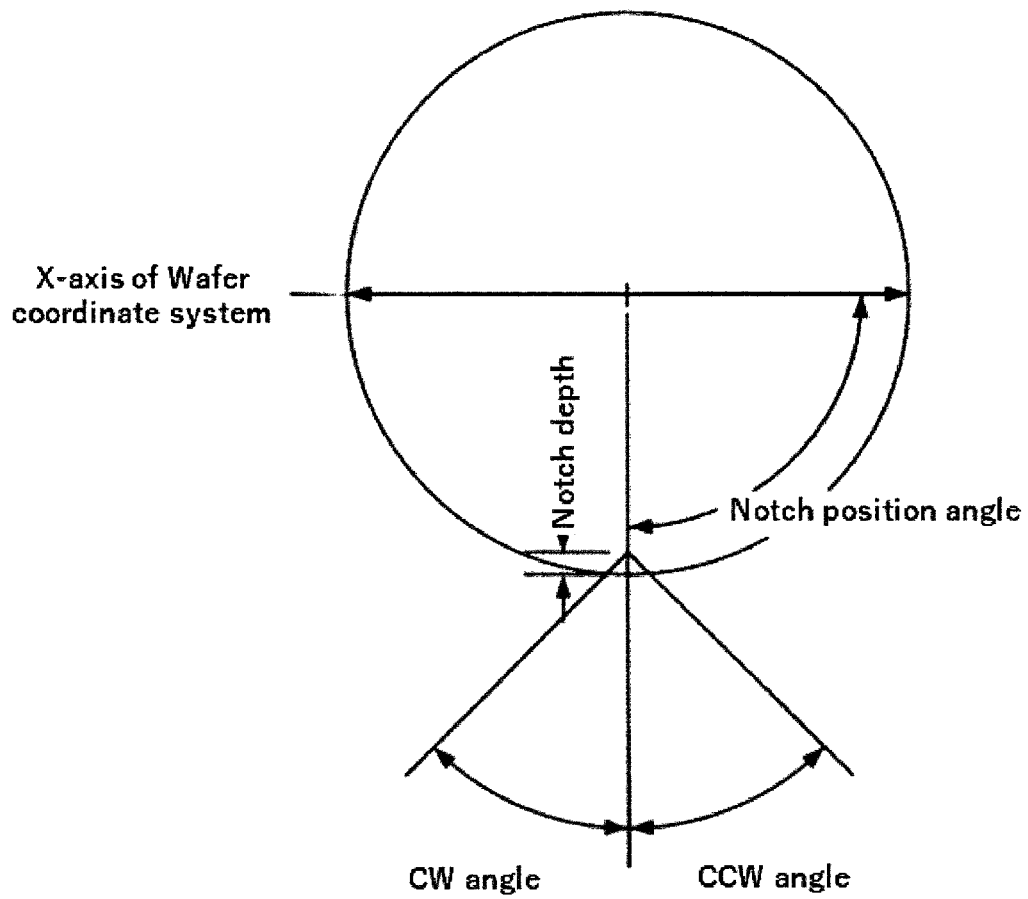
FIG. 14a and FIG. 14b illustrate equipment shape variables of a wafer notch according to an exemplary embodiment of the present invention.
Figure 14B:
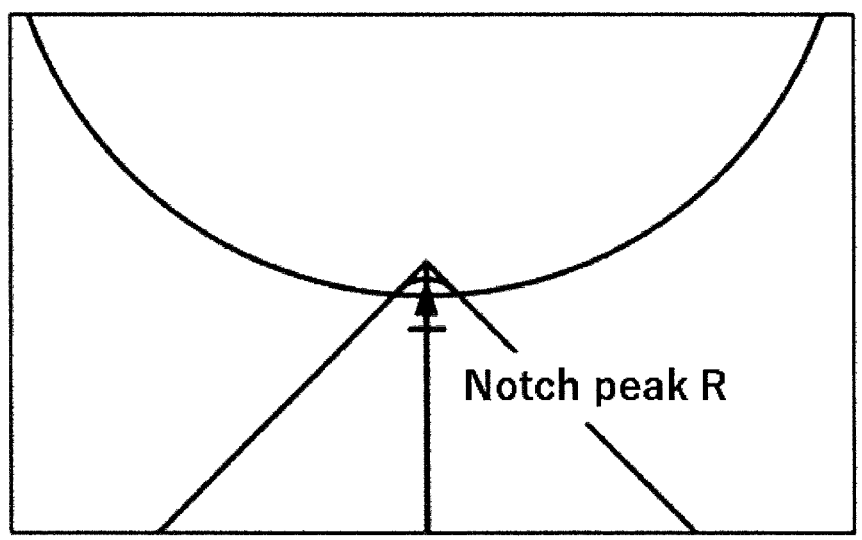
Figure 15A:
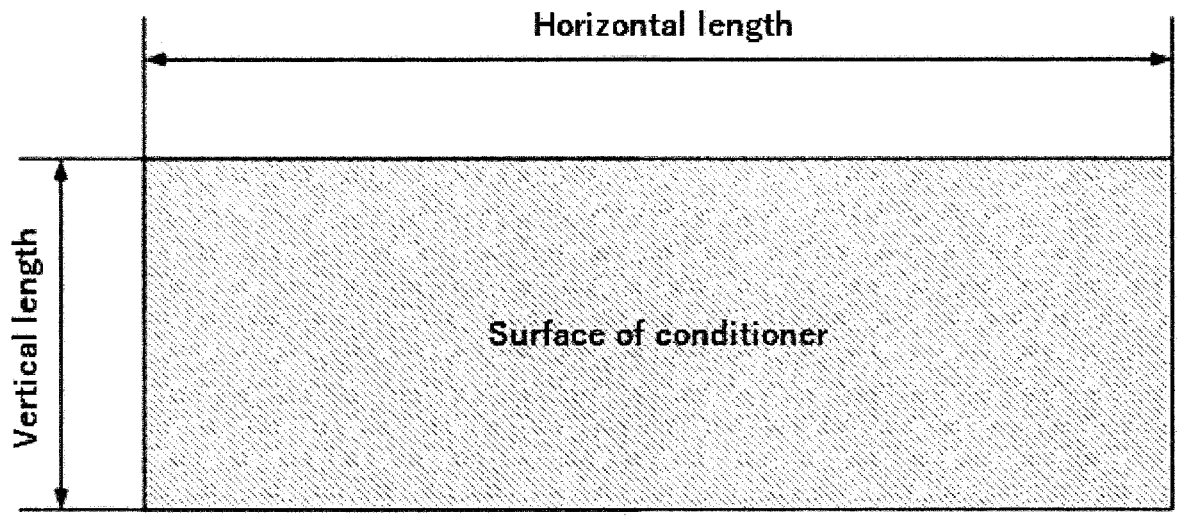
FIG. 15a, FIG. 15b, and FIG. 15c illustrate equipment shape variables of a pad conditioner according to an exemplary embodiment of the present invention.
Figure 15B:
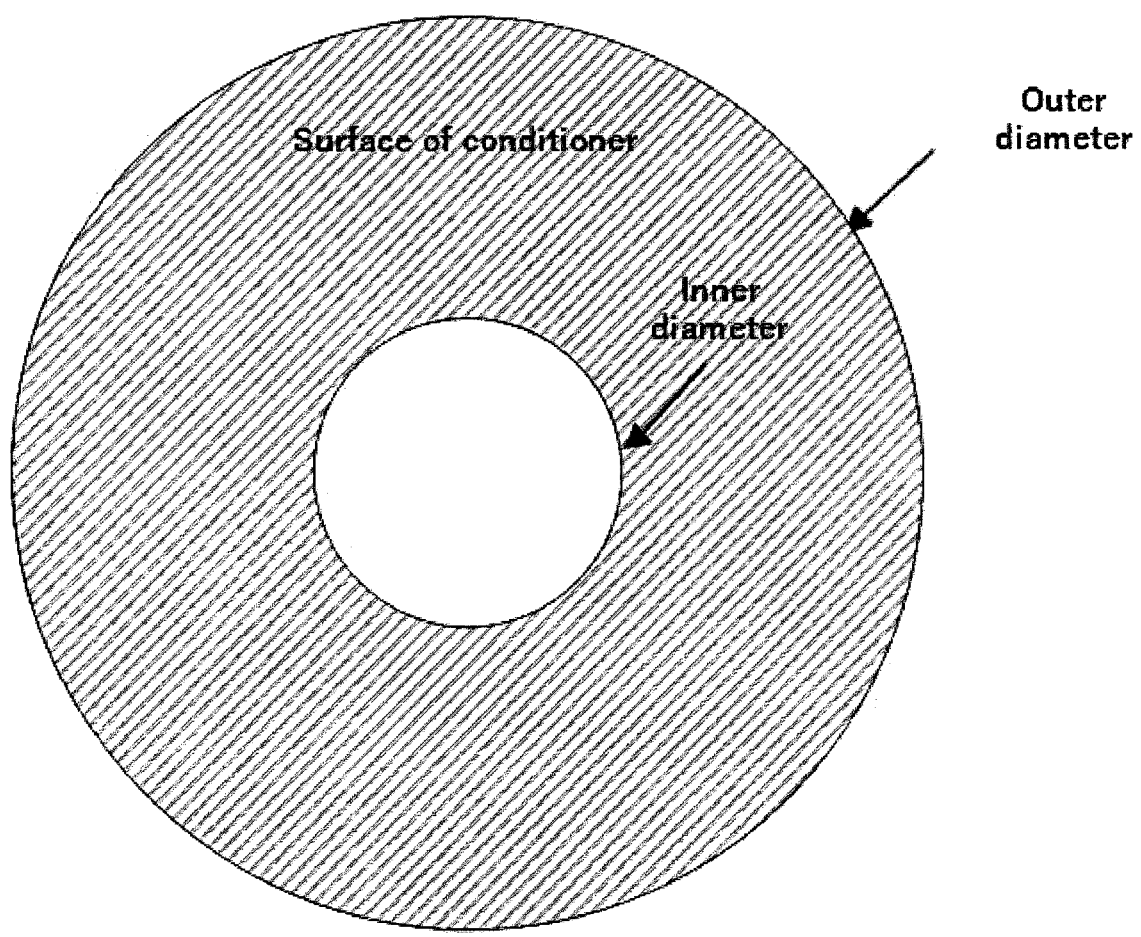
Figure 15C:
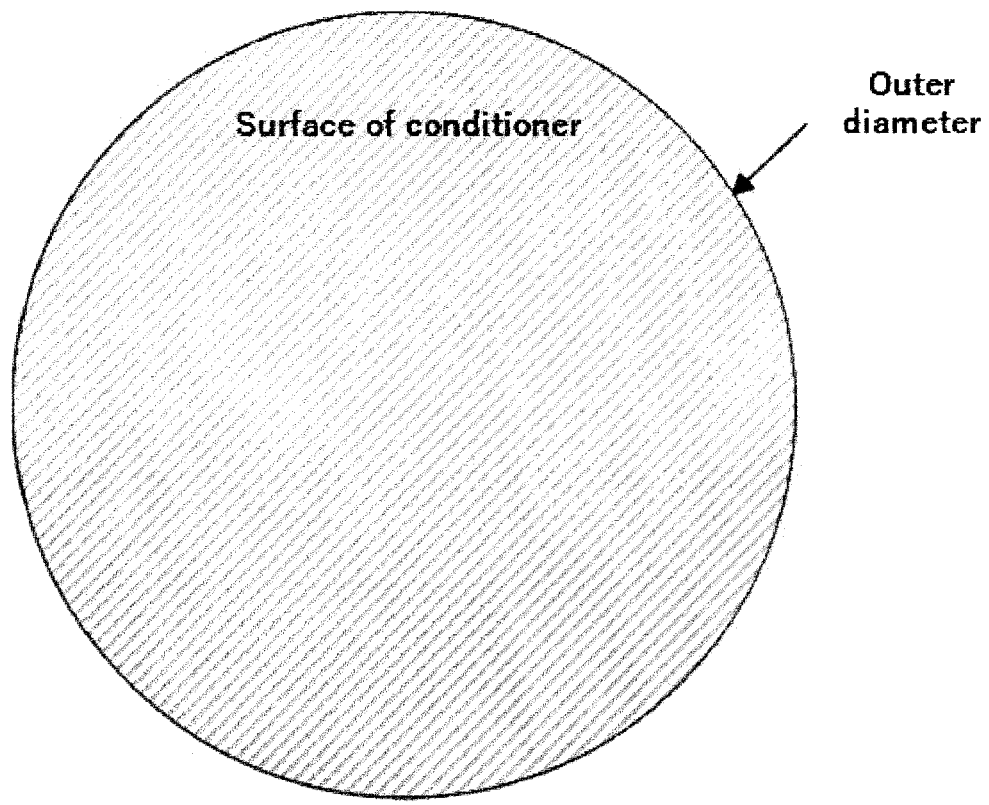
Figure 16A:
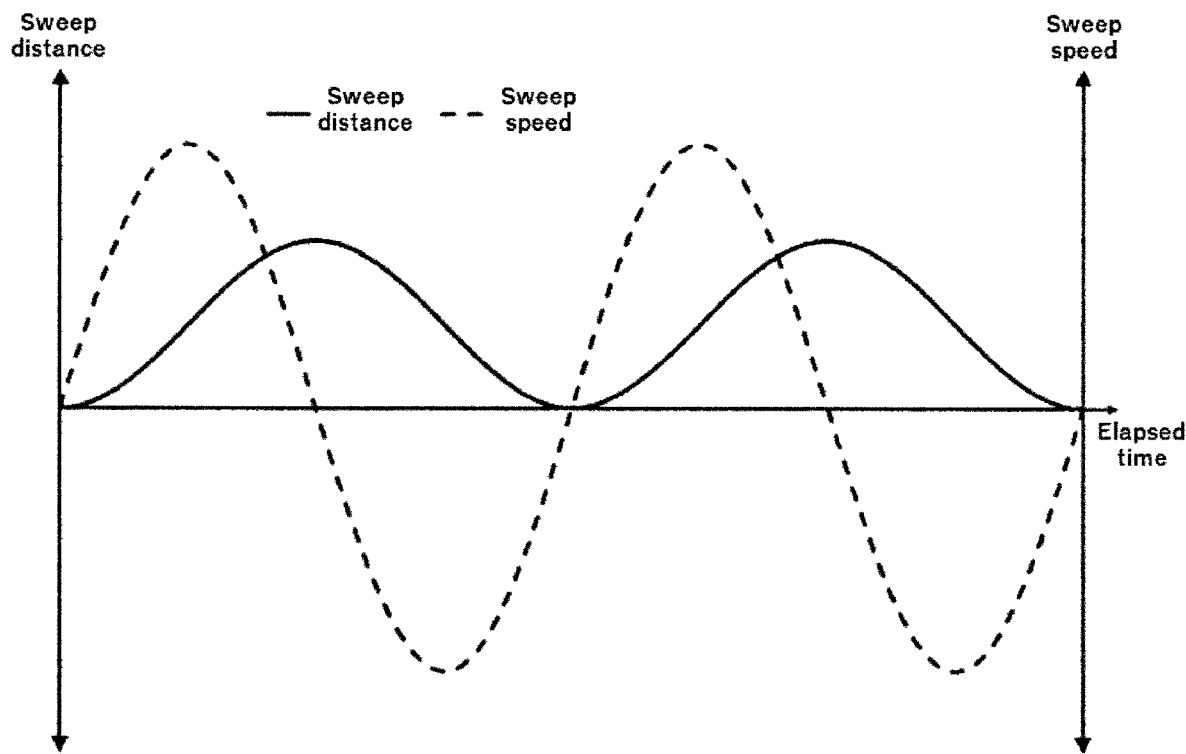
FIG. 16a illustrates a sinusoidal sweep speed according to an exemplary embodiment of the present invention.
Figure 16B:
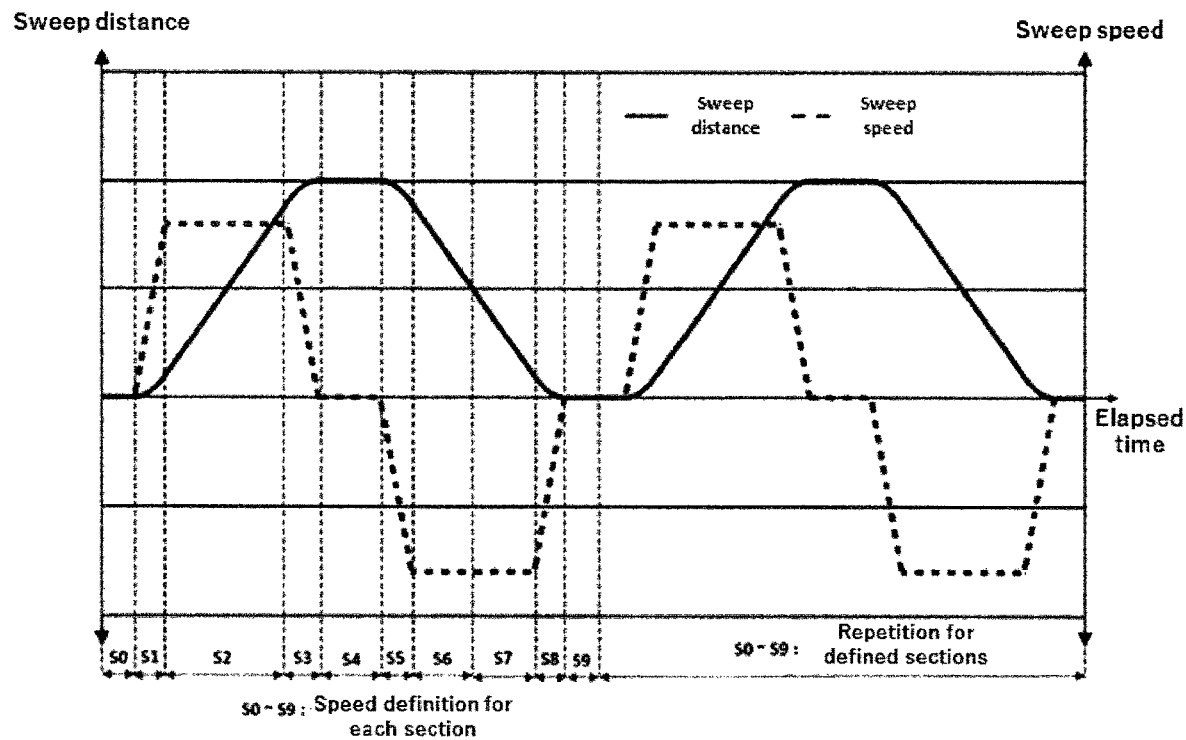
FIG. 16b illustrates a speed step sweep function according to an exemplary embodiment of the present invention.
Figure 17:
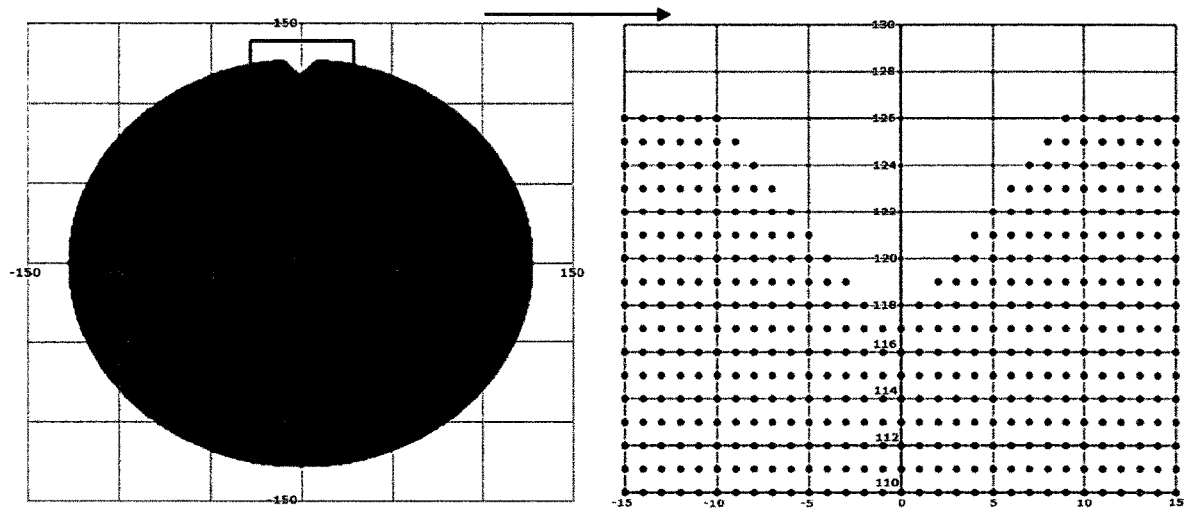
FIG. 17 illustrates an example of generating calculation nodes according to an exemplary embodiment of the present invention.
Figure 18:
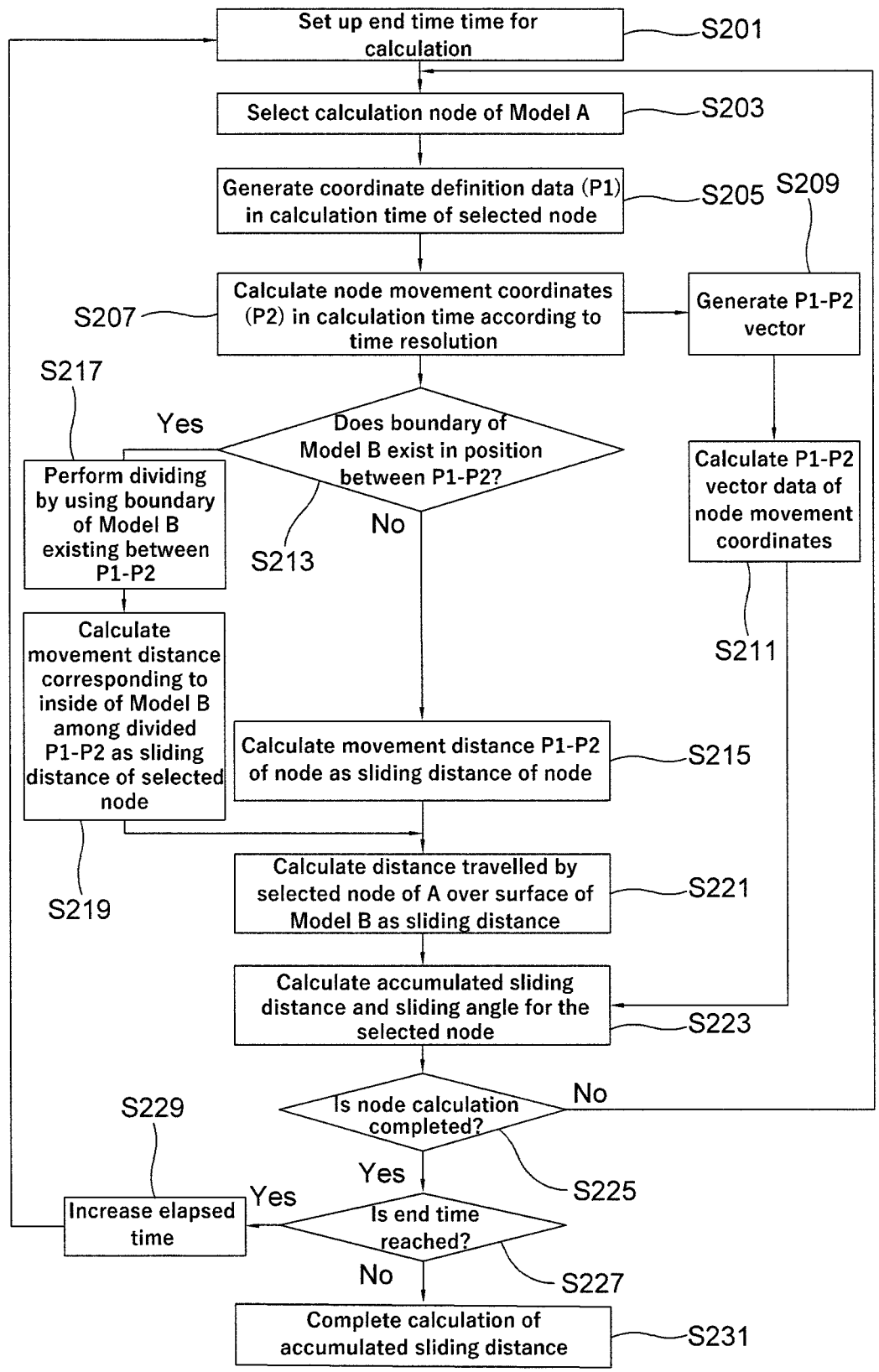
FIG. 18 illustrates a flow chart showing a process of calculating a sliding distance between A and B and a motion vector by using a node of A according to an exemplary embodiment of the present invention.
Figure 19:
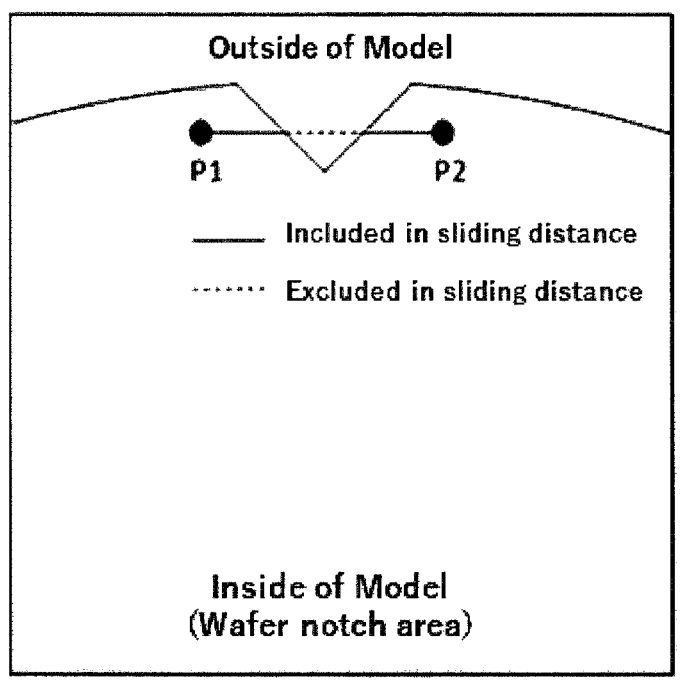
FIG. 19 illustrates an example of calculating a sliding distance of a pad node over a wafer surface according to an exemplary embodiment of the present invention.
Figure 20:
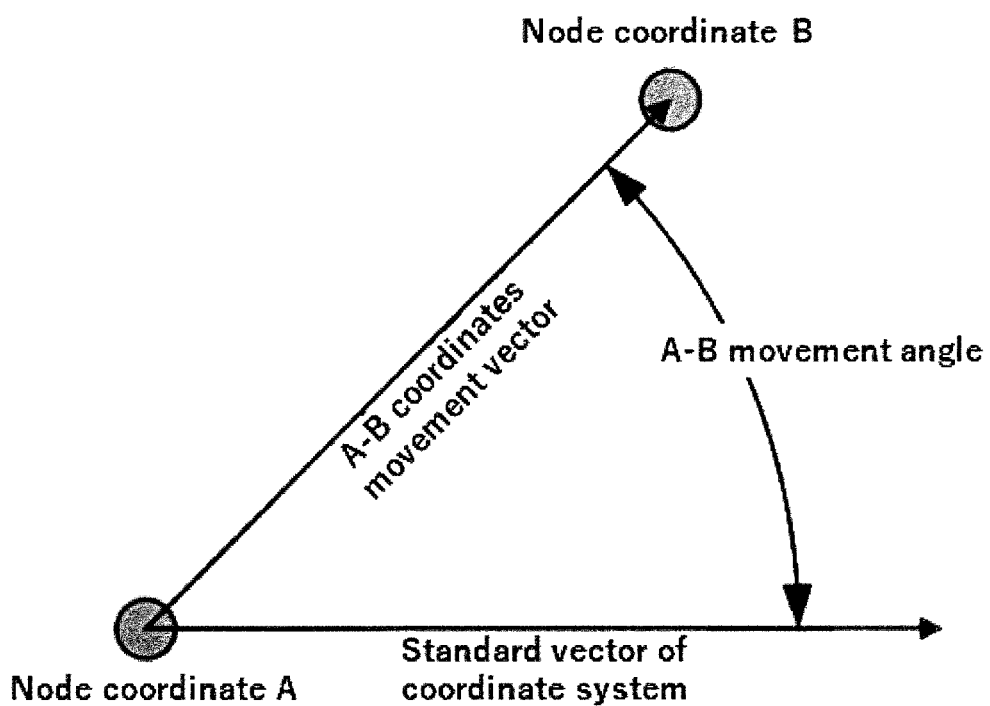
FIG. 20 illustrates an example of calculating an angle corresponding to a movement of node coordinates according to an exemplary embodiment of the present invention.
Figure 21:
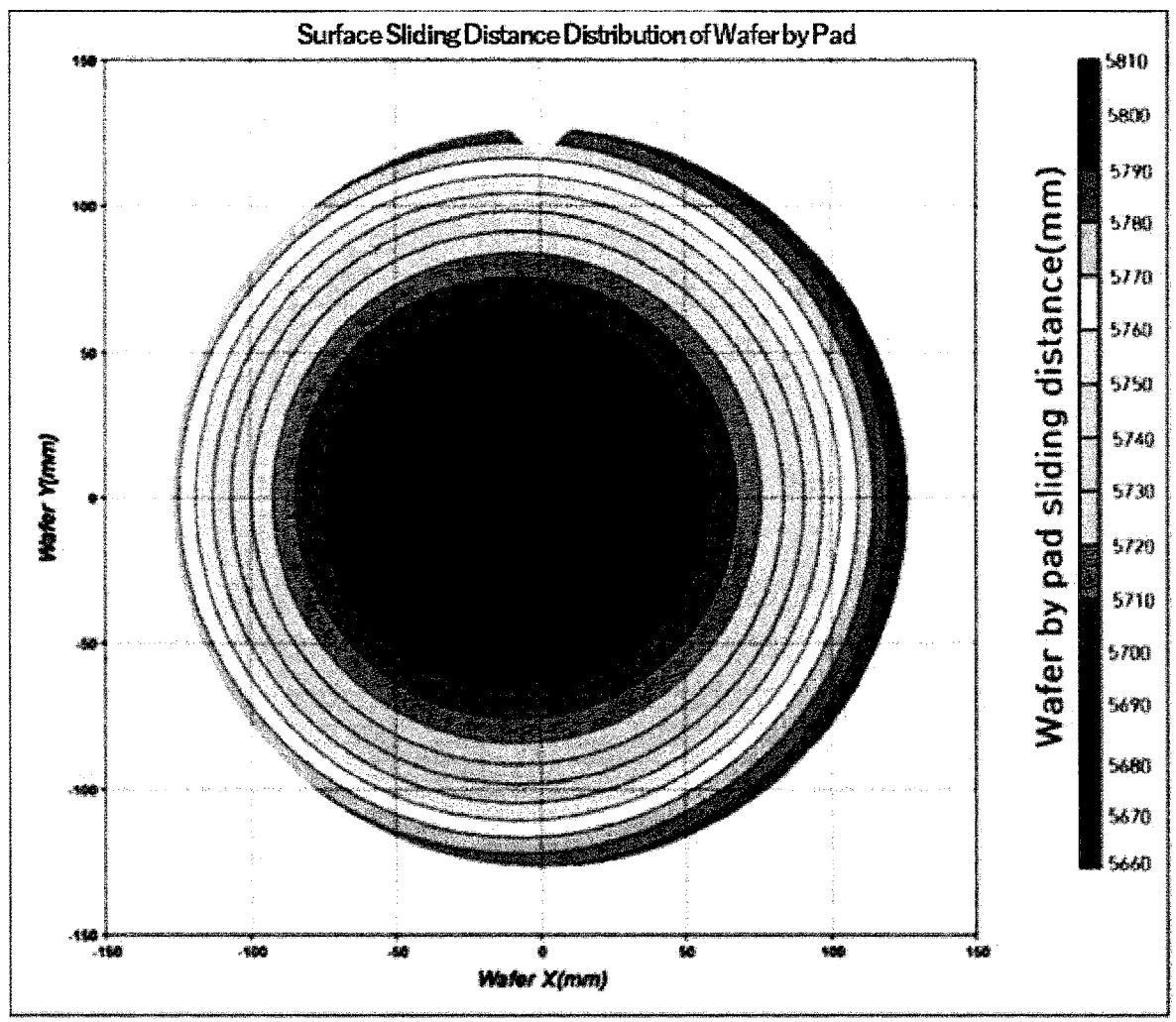
FIG. 21 illustrates an image of a report on a wafer sliding distance distribution analysis performed by a pad of a "Wafer by Pad" type according to an exemplary embodiment of the present invention.
Figure 22:
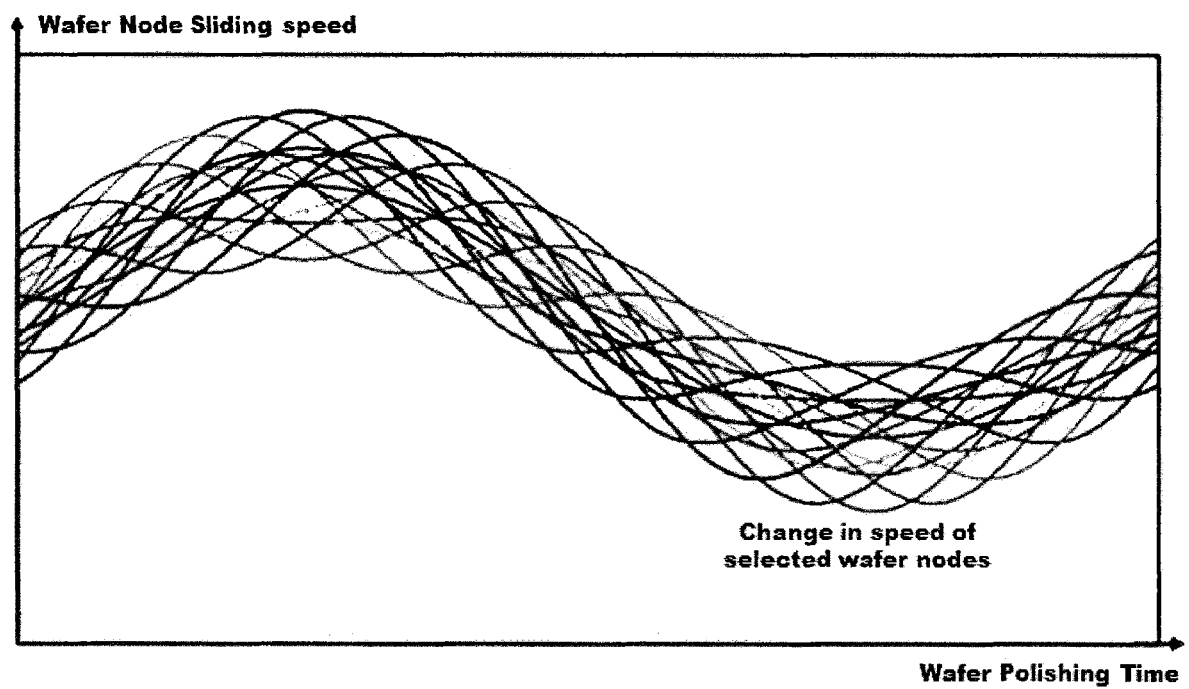
FIG. 22 illustrates a graph showing changes in a wafer surface polishing speed according to an exemplary embodiment of the present invention.
Figure 23A:
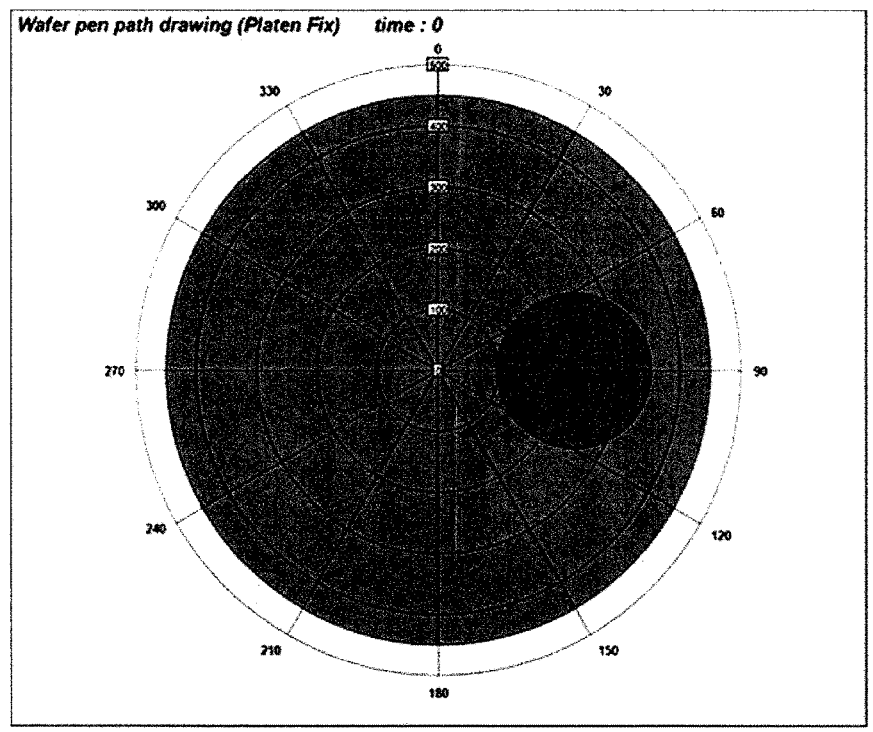
FIG. 23a and FIG. 23b illustrate trajectories drawn by nodes positioned on the wafer according to an exemplary embodiment of the present invention.
Figure 23B:
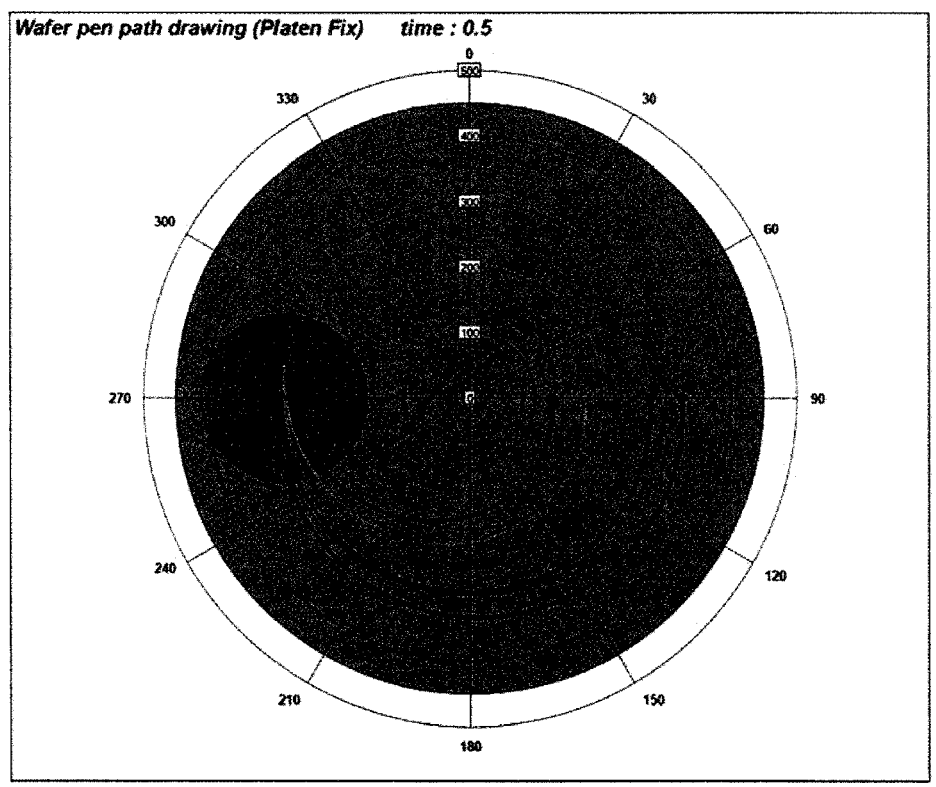
Figure 24A:
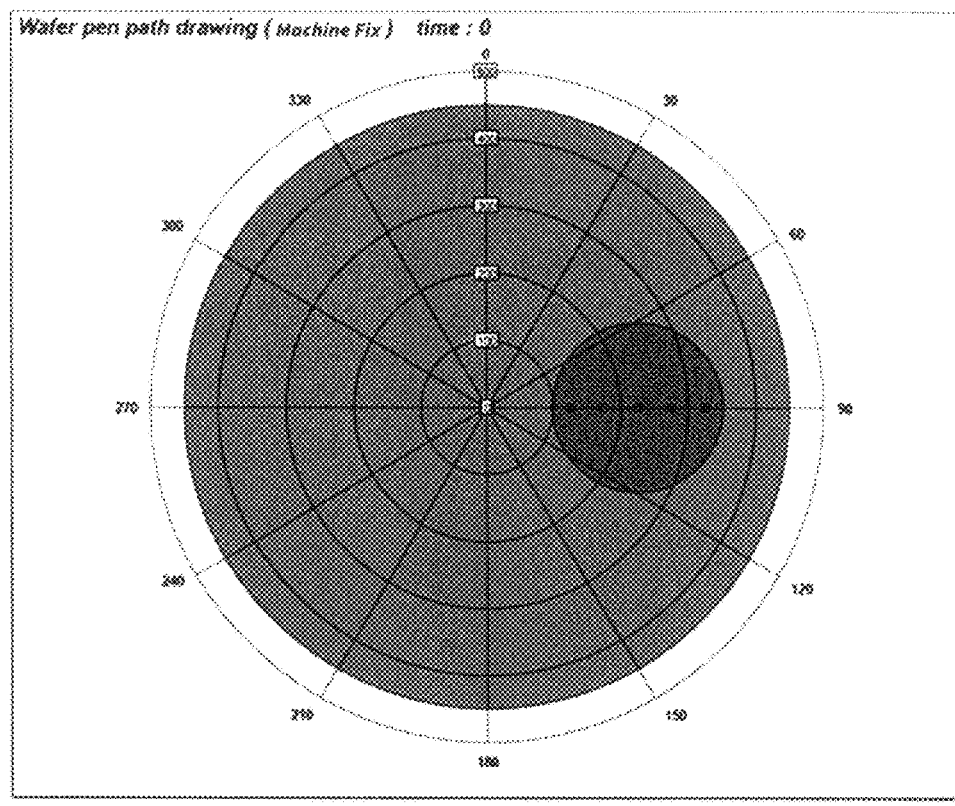
FIG. 24a and FIG. 24b illustrate trajectories drawn by nodes positioned on the wafer according to another exemplary embodiment of the present invention.
Figure 24B:
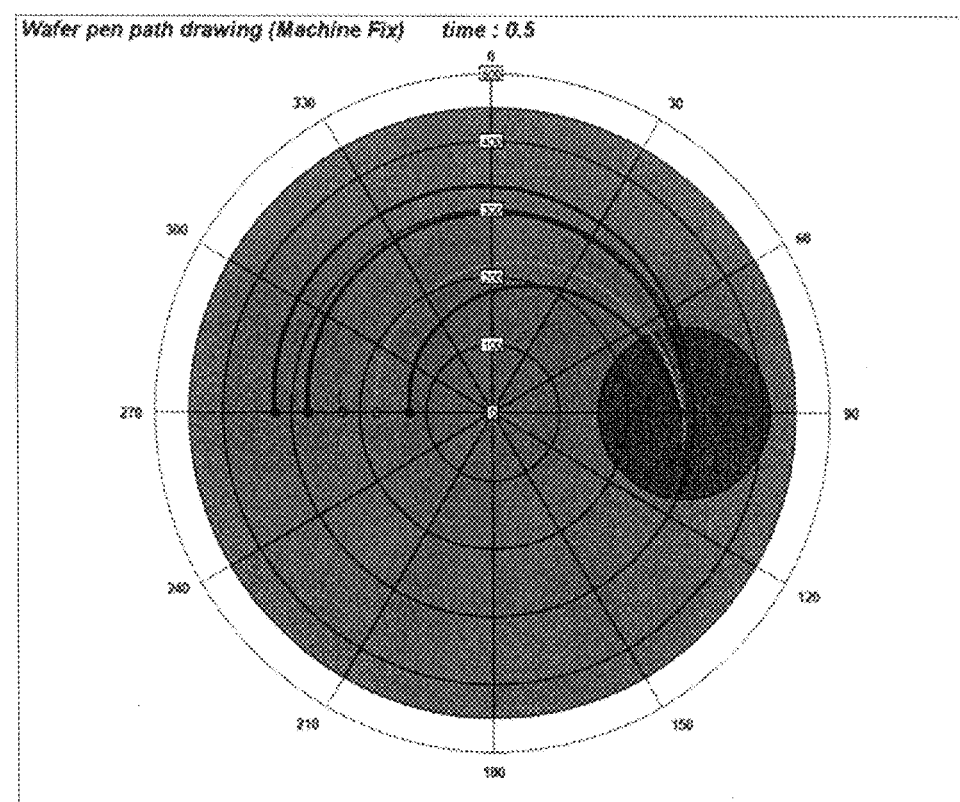
Figure 25A:
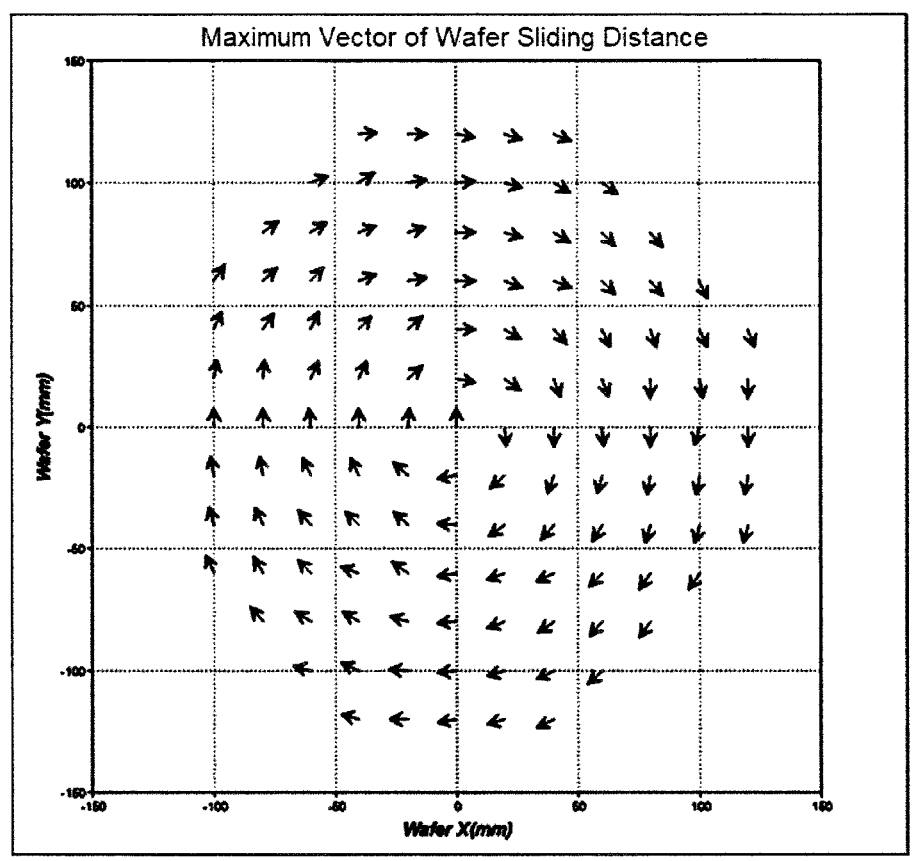
FIG. 25a illustrates a sliding distance maximum vector according to an exemplary embodiment of the present invention.
Figure 25B:
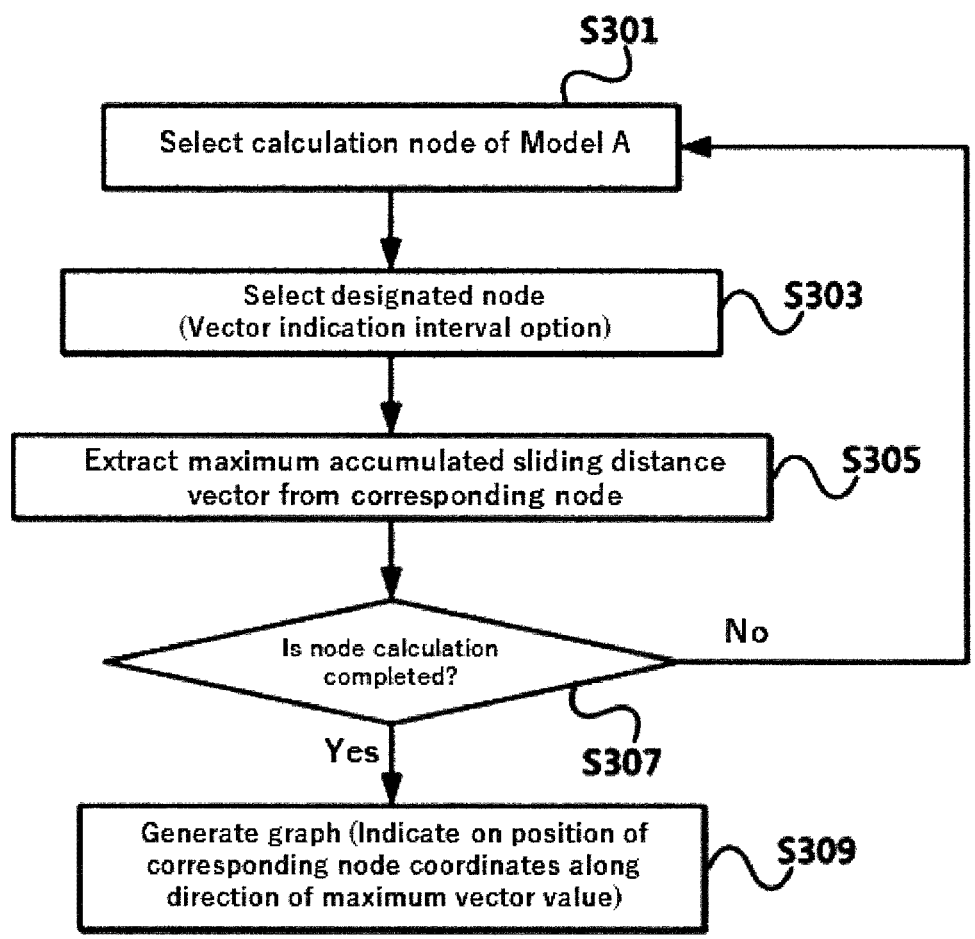
FIG. 25b illustrates a flow chart showing a process of generating a sliding distance maximum vector according to an exemplary embodiment of the present invention.
Figure 26A:
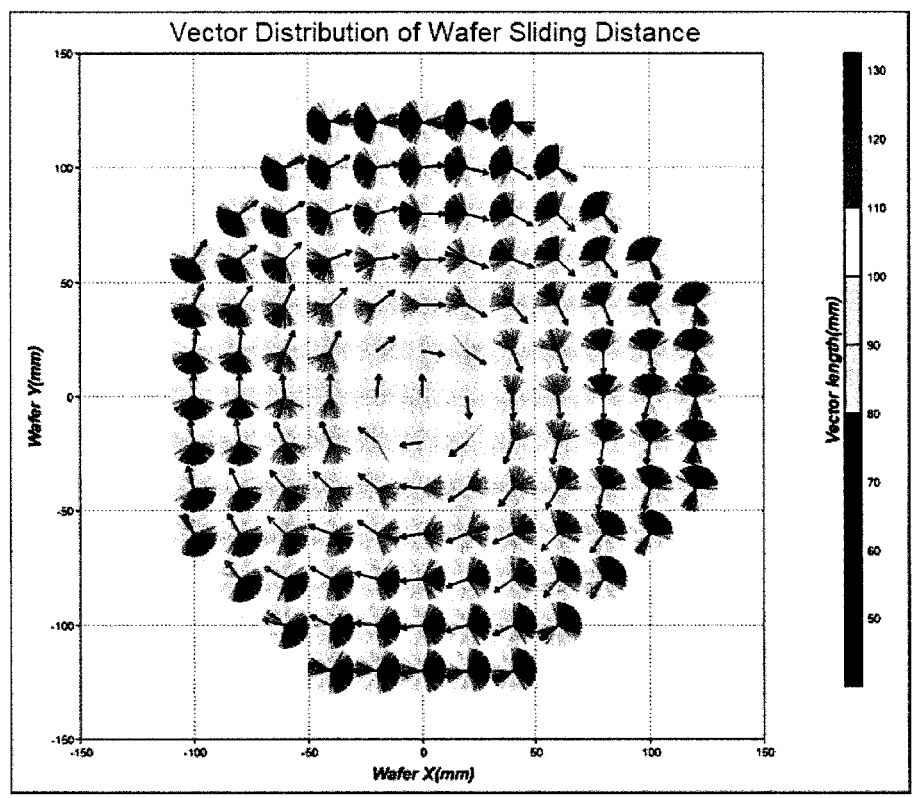
FIG. 26a illustrates a sliding distance vector distribution according to an exemplary embodiment of the present invention.
Figure 26B:
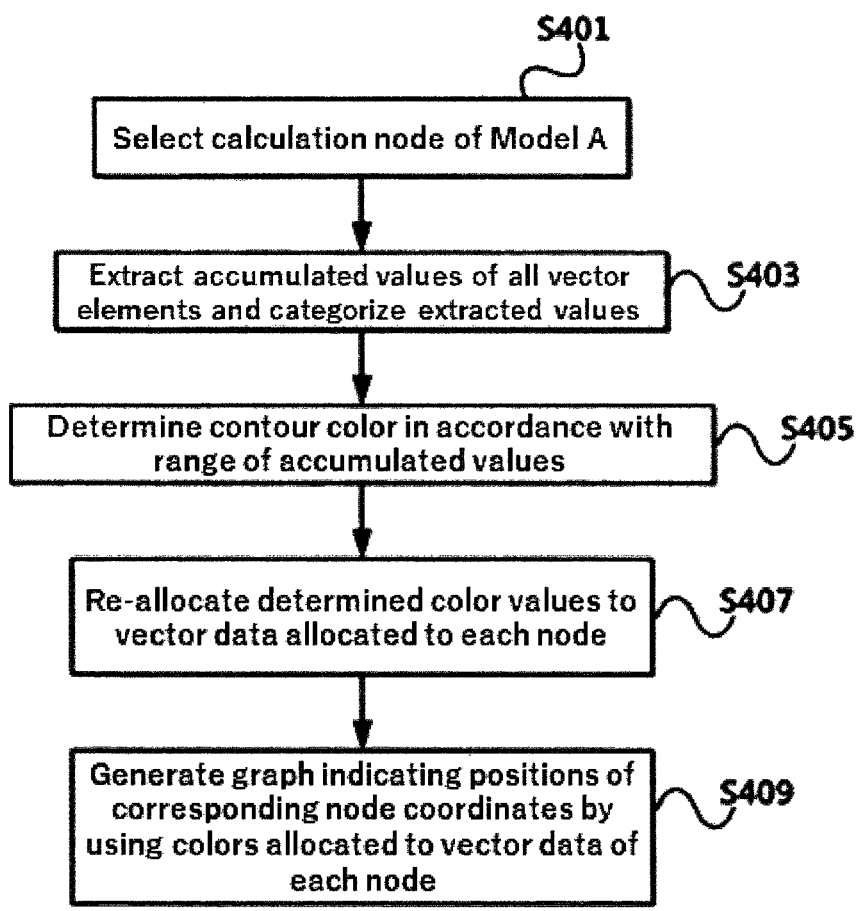
FIG. 26b illustrates a flow chart showing a process of generating a sliding distance vector distribution according to an exemplary embodiment of the present invention.
Figure 27A:
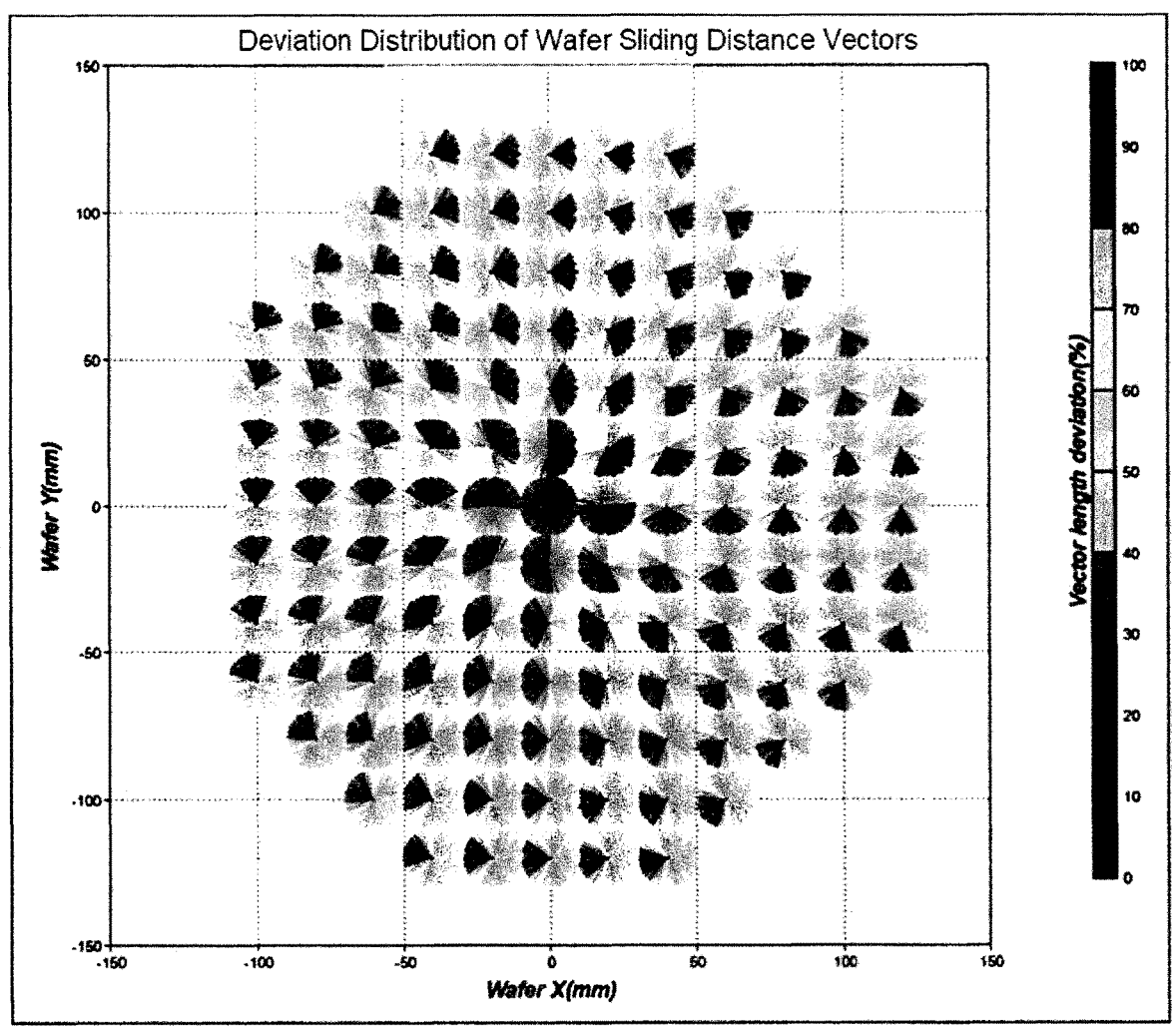
FIG. 27a illustrates a sliding vector deviation according to an exemplary embodiment of the present invention.
Figure 27B:
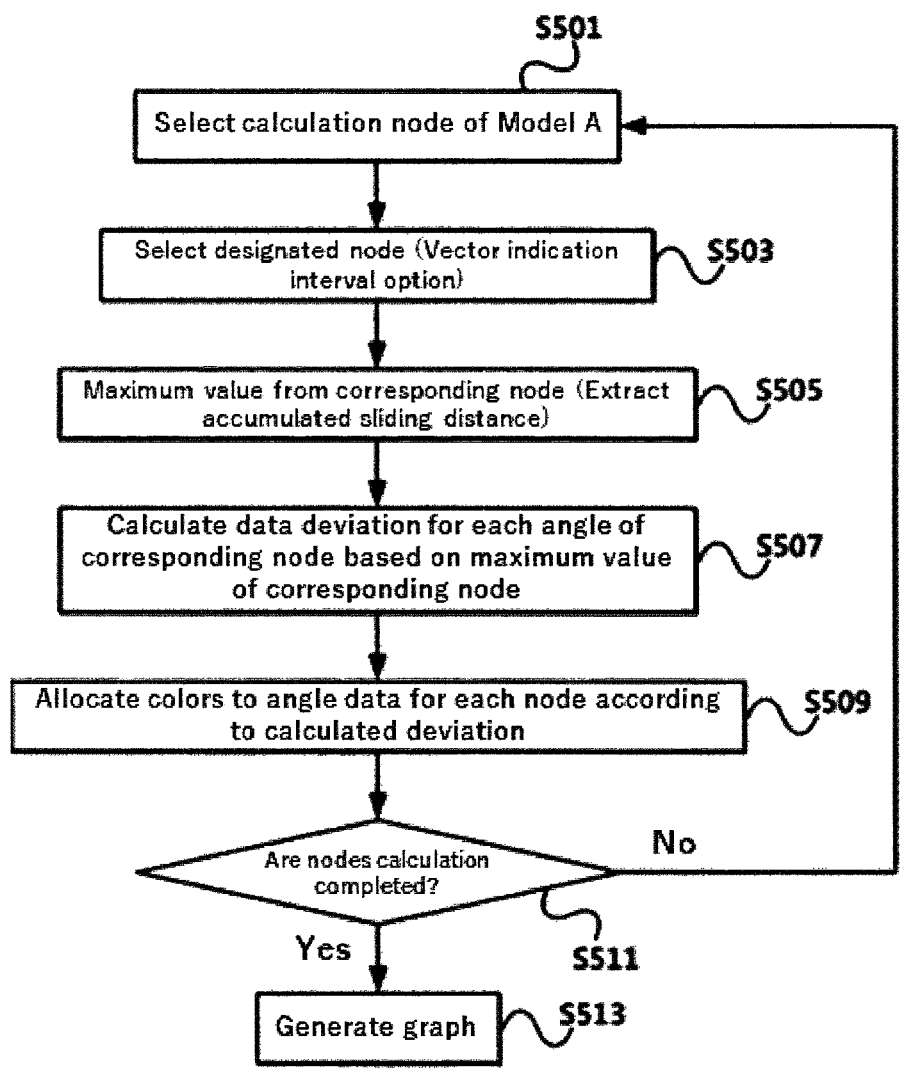
FIG. 27b illustrates a flow chart showing a process of generating a sliding vector deviation according to an exemplary embodiment of the present invention.
Figure 28:
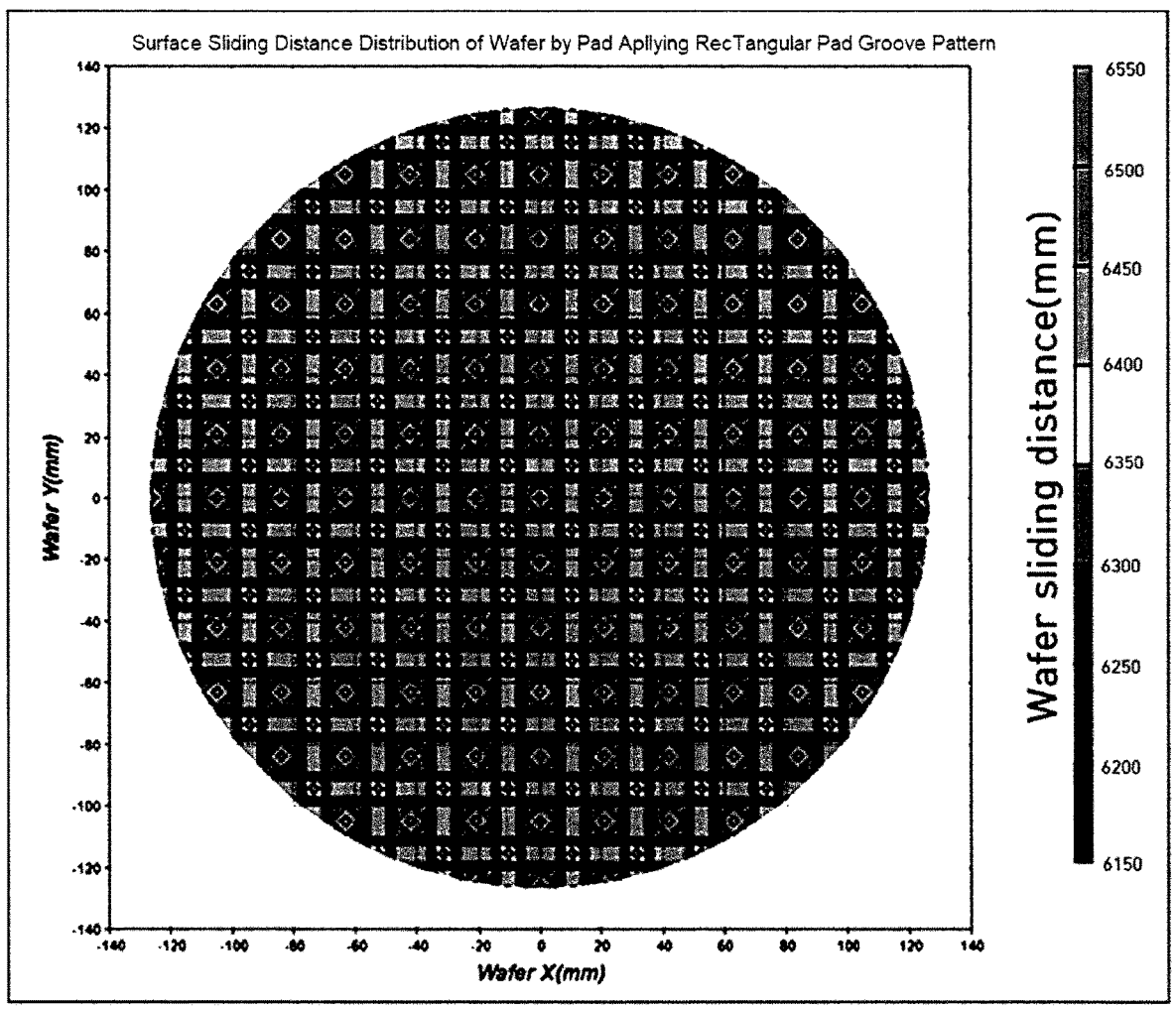
FIG. 28 illustrates an image of a report on a "Wafer by Pad" type wafer sliding distance distribution analysis performed by a pad adopting rectangular groove patterns according to an exemplary embodiment of the present invention.
Figure 29:
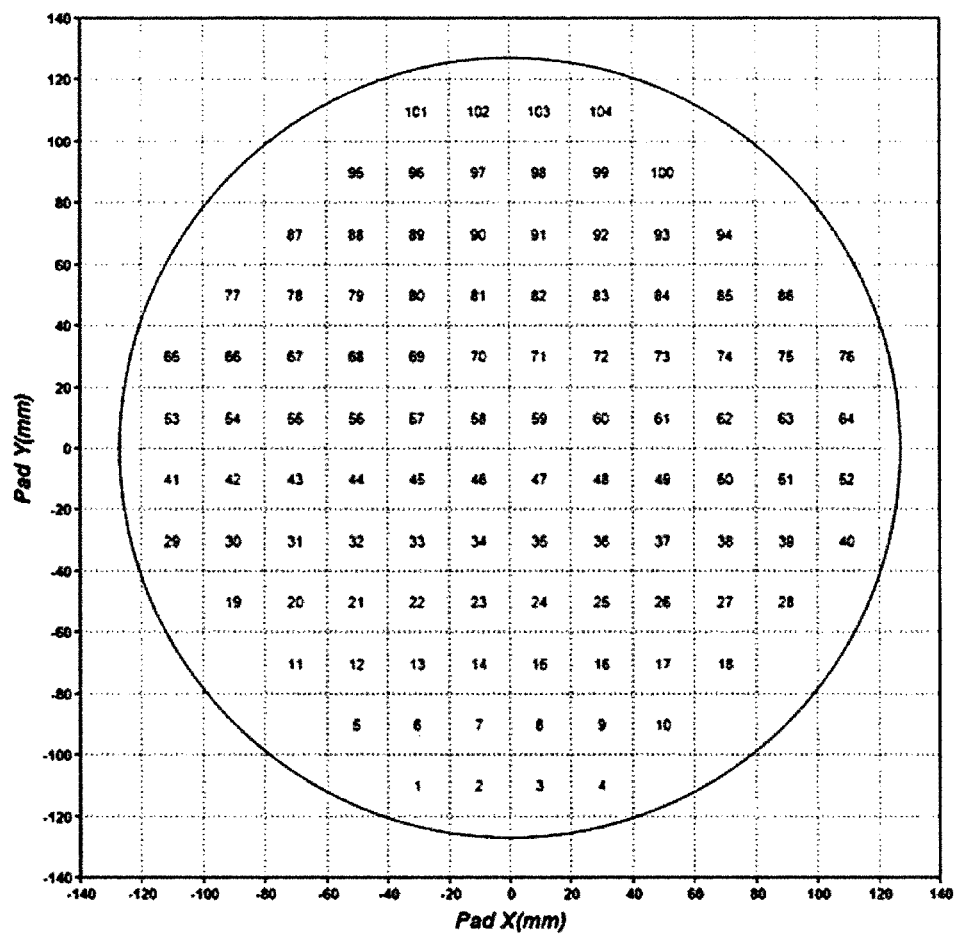
FIG. 29 illustrates an example of a distribution status of chip dies on a wafer and a chip die number according to an exemplary embodiment of the present invention.
Figure 30A:
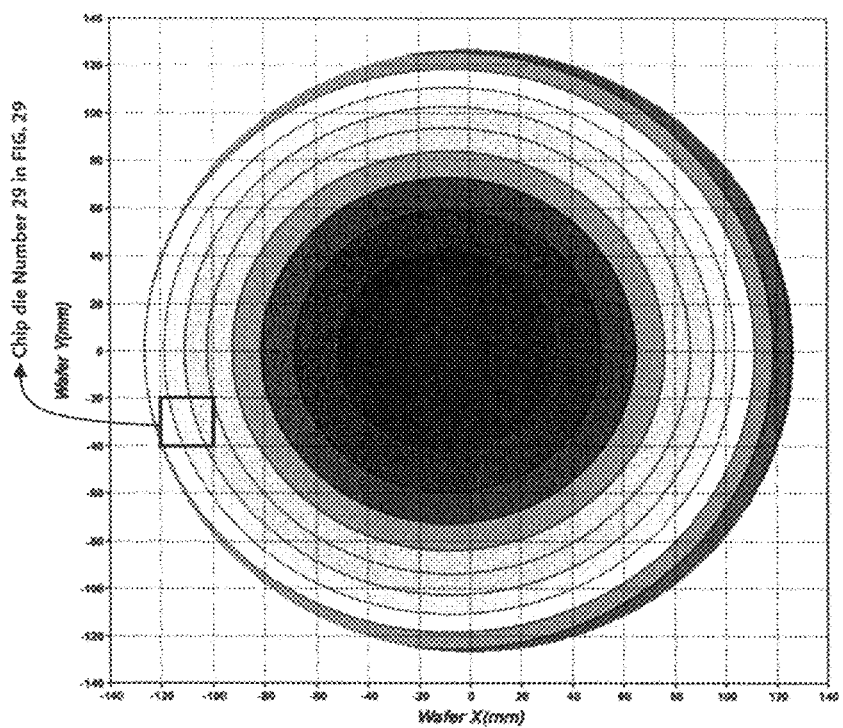
FIG. 30a illustrates a position of chip die Number 29 shown in FIG. 29 from the report on the "Wafer by pad" type wafer sliding distance distribution analysis.
Figure 30B:
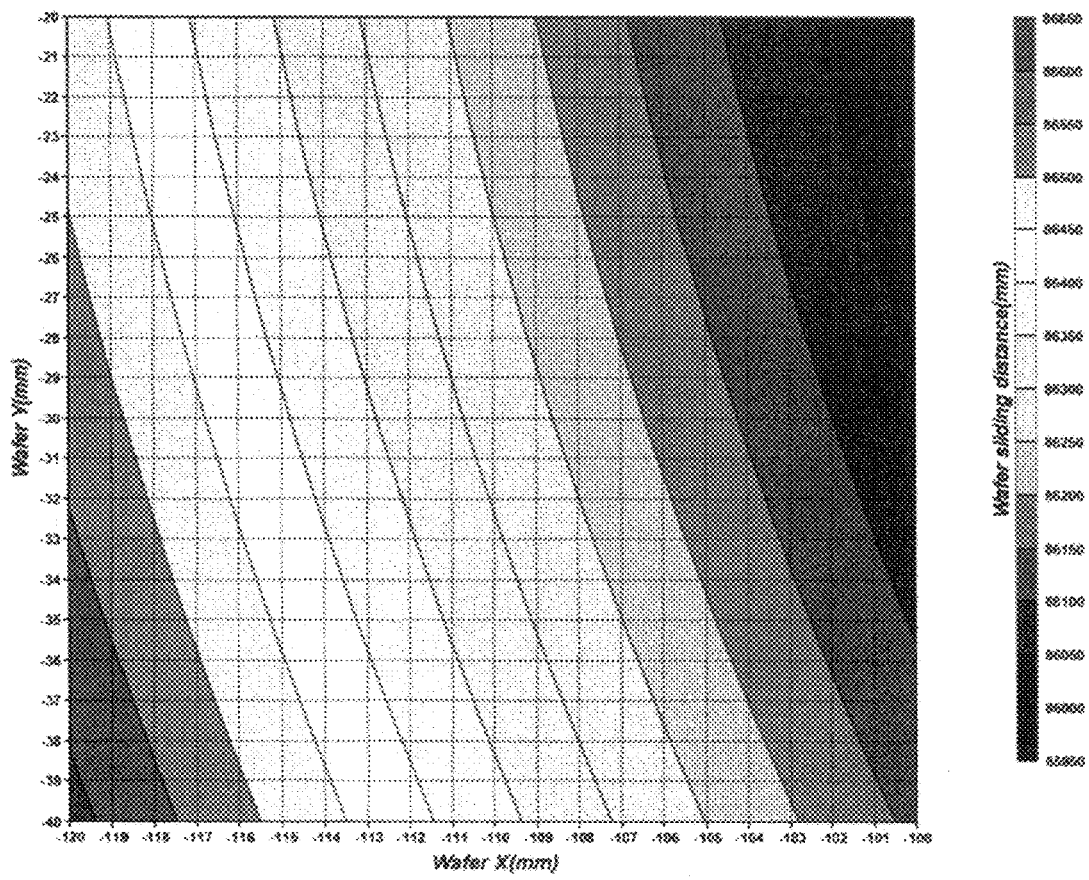
Figure 31:
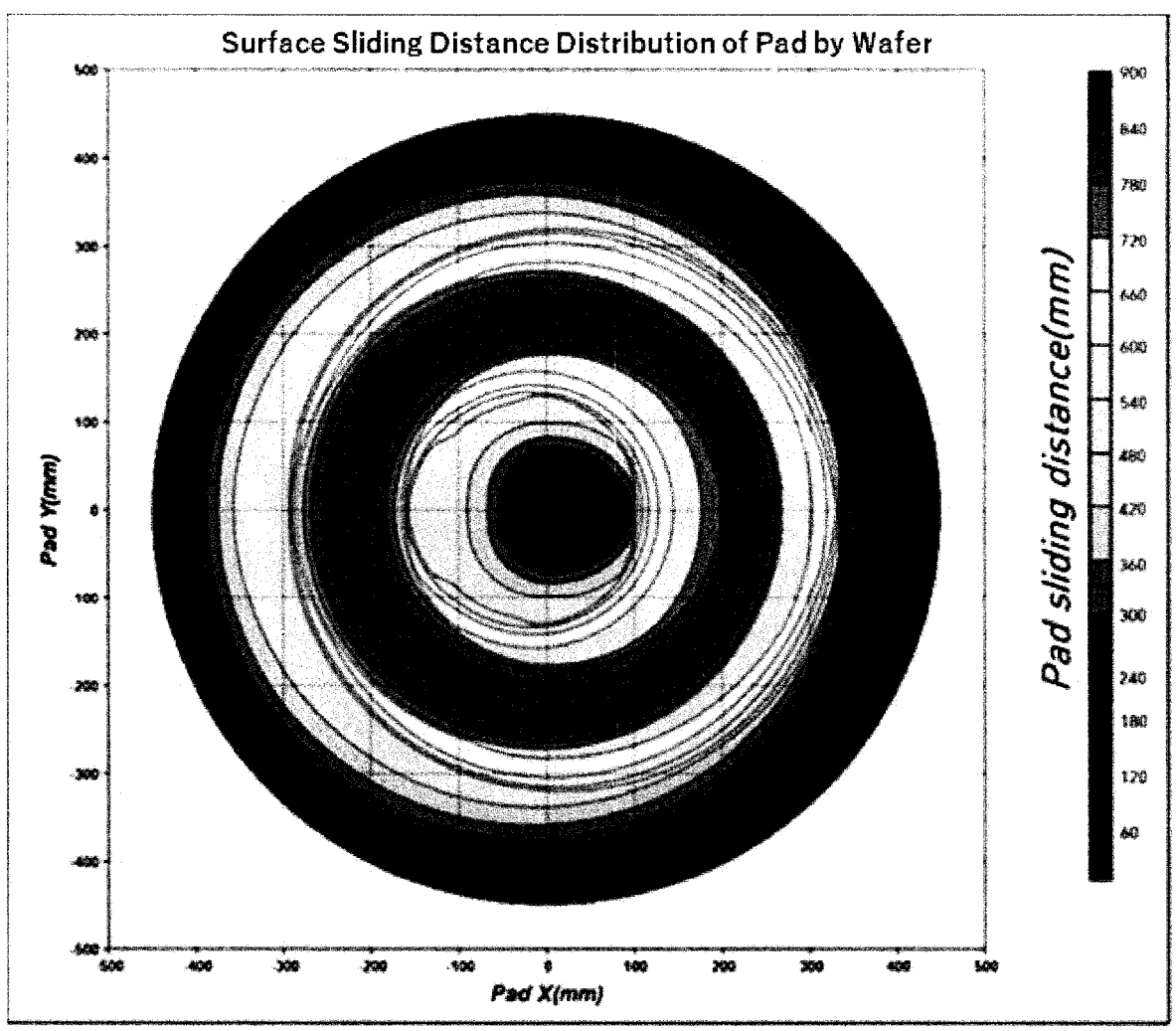
FIG. 31 illustrates an image of a report on a pad sliding distance distribution analysis performed by a wafer of a "Pad by Wafer" type according to an exemplary embodiment of the present invention.
Figure 32:
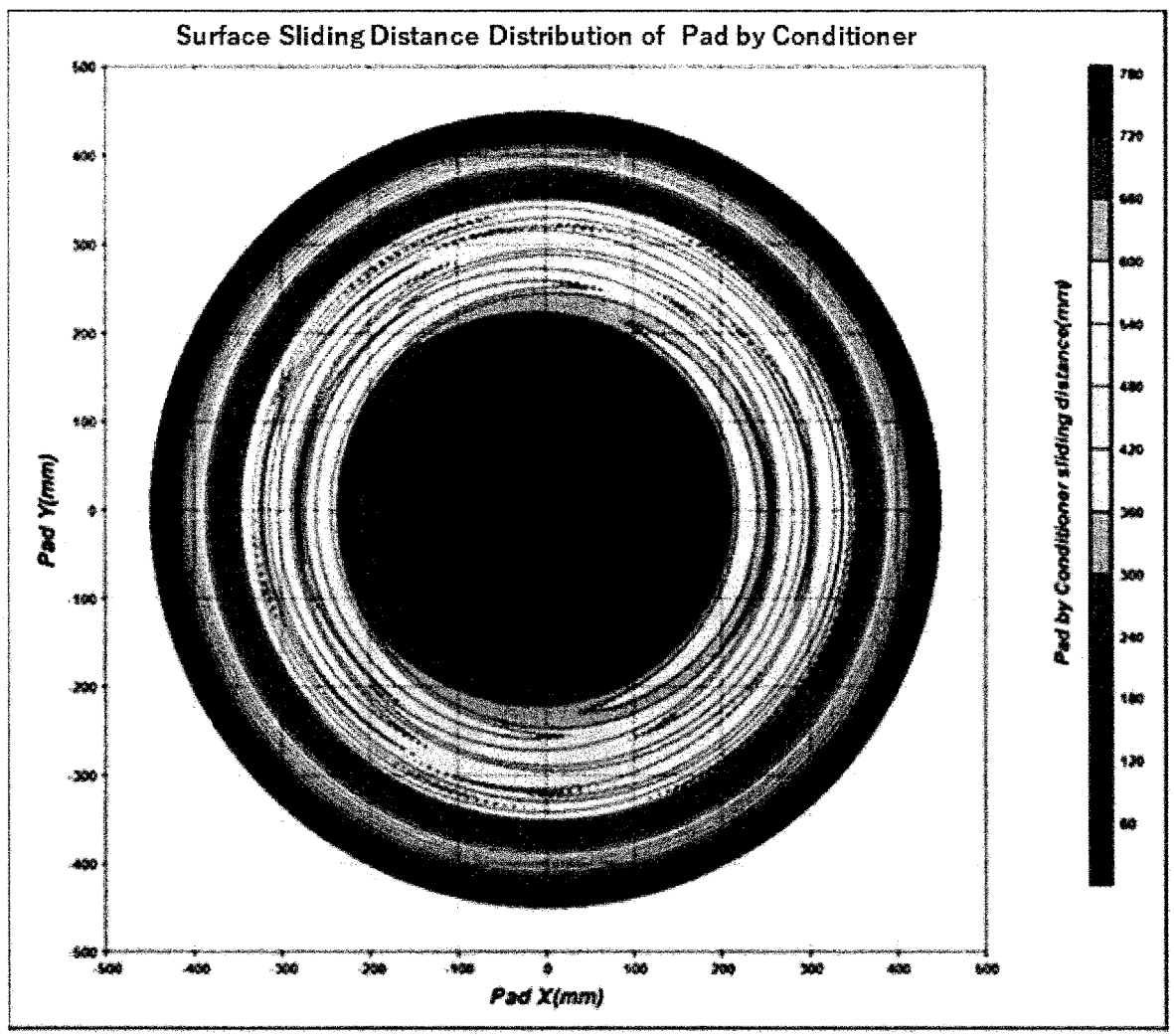
FIG. 32 illustrates an image of a report on a pad sliding distance distribution analysis performed by a conditioner of a "Pad by Conditioner" type according to an exemplary embodiment of the present invention.
Figure 33:
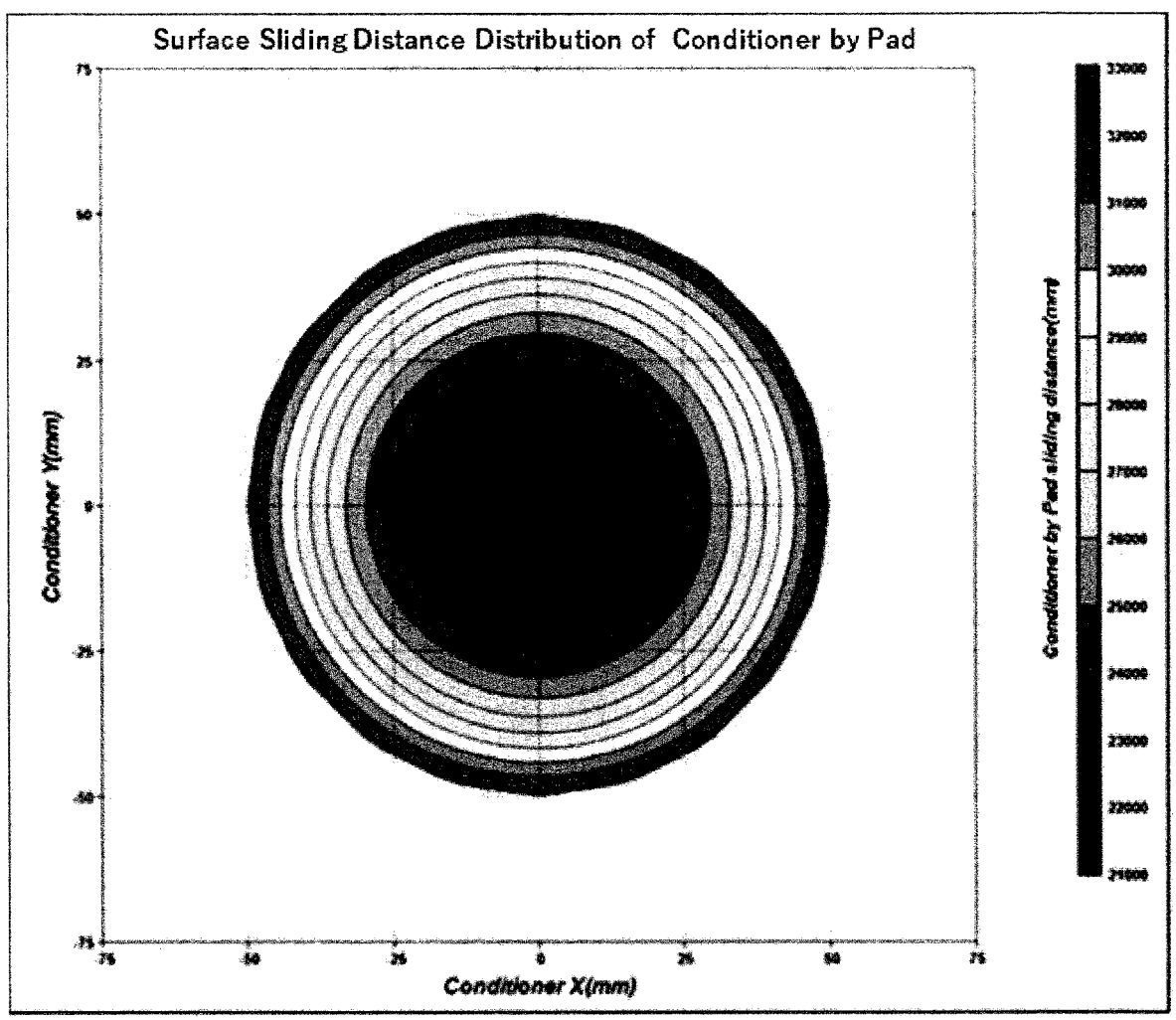
FIG. 33 illustrates an image of a report on a conditioner sliding distance distribution analysis performed by a pad of a "Conditioner by Pad" type according to an exemplary embodiment of the present invention.
Figure 34:
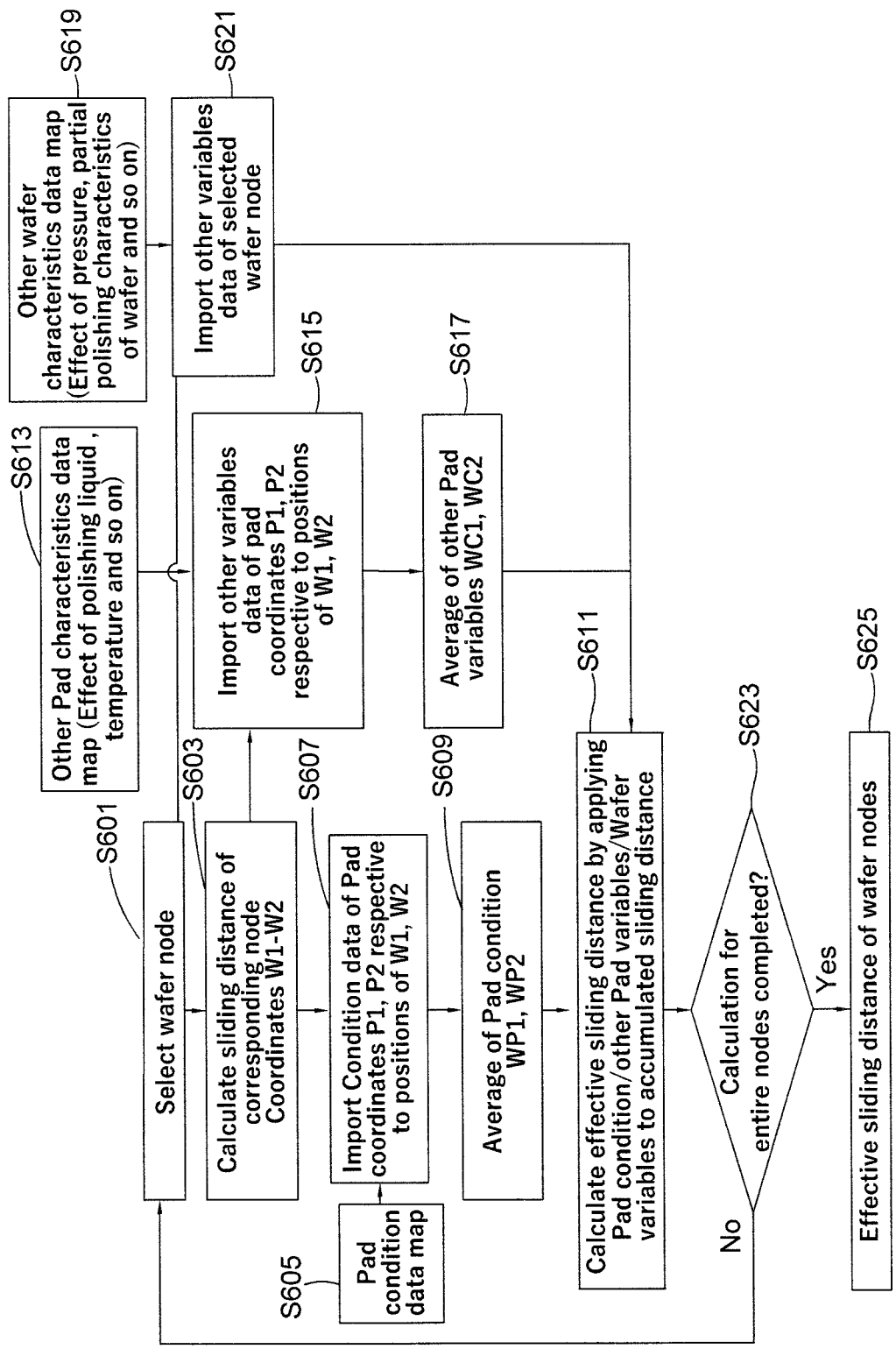
FIG. 34 illustrates a flow chart showing a process for deriving an effective sliding distance of a wafer according to an exemplary embodiment of the present invention.
Figure 35:
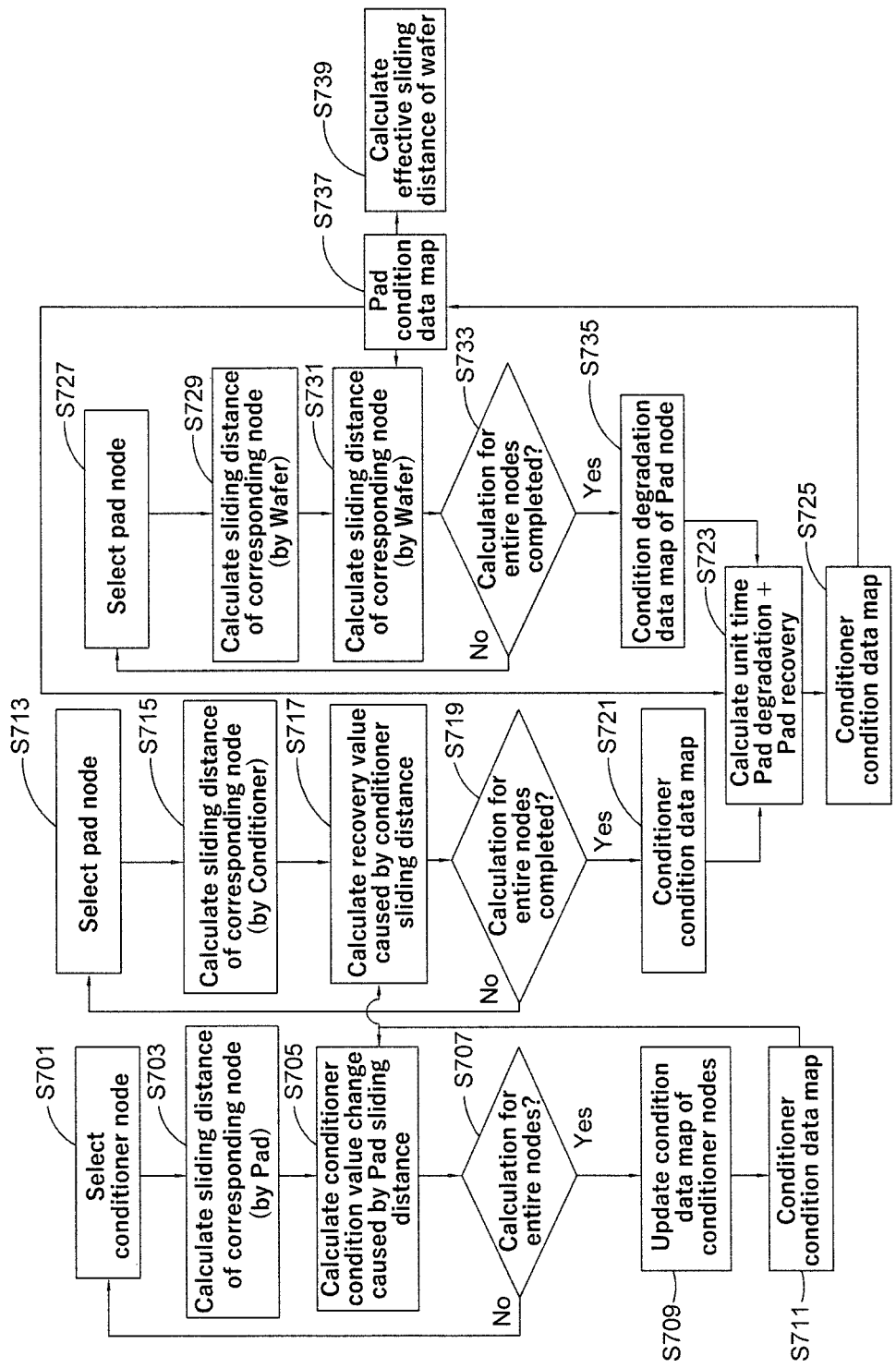
FIG. 35 illustrates a correlated flow chart of analyzing pad condition degradation and pad condition recovery according to an exemplary embodiment of the present invention.

FIG. 2 illustrates a flow chart showing a polishing behavior analysis method according to an exemplary embodiment of the present invention. FIG. 3a illustrates a ring type (doughnut type) pad according to an exemplary embodiment of the present invention. FIG. 3b illustrates a disc type circular pad according to an exemplary embodiment of the present invention. FIG. 4 illustrates a belt type pad according to an exemplary embodiment of the present invention. FIG. 5 illustrates an example of installing a pad and a head according to an exemplary embodiment of the present invention. FIG. 6a illustrates a form of groove patterns according to an exemplary embodiment of the present invention. FIG. 6b illustrates a form of groove patterns according to another exemplary embodiment of the present invention. FIG. 6c illustrates a form of groove patterns according to yet another exemplary embodiment of the present invention. FIG. 7 illustrates an example of installing a wafer on a head according to an exemplary embodiment of the present invention. FIG. 8a illustrates an example of installing multiple wafers on a head according to another exemplary embodiment of the present invention. FIG. 8b illustrates an example of installing multiple wafers on ahead according to yet another exemplary embodiment of the present invention. FIG. 9 illustrates an example of determining a head position by linear sweep according to an exemplary embodiment of the present invention. FIG. 10 illustrates an example of determining a head position by swing arm sweep according to an exemplary embodiment of the present invention. FIG. 11 illustrates equipment shape variables of a planetary gear head according to an exemplary embodiment of the present invention. FIG. 12 illustrates equipment shape variables of wafer coordinates according to an exemplary embodiment of the present invention. FIG. 13 illustrates equipment shape variables of a wafer flat according to an exemplary embodiment of the present invention. FIG. 14a and FIG. 14b illustrate equipment shape variables of a wafer notch according to an exemplary embodiment of the present invention. FIG. 15a, FIG. 15b, and FIG. 15c illustrate equipment shape variables of a pad conditioner according to an exemplary embodiment of the present invention. FIG. 16a illustrates a sinusoidal sweep speed according to an exemplary embodiment of the present invention. FIG. 16b illustrates a speed step sweep function according to an exemplary embodiment of the present invention. FIG. 17 illustrates an example of generating calculation nodes according to an exemplary embodiment of the present invention. FIG. 18 illustrates a flow chart showing a process of calculating a sliding distance between A and B and a motion vector by using a node of A according to an exemplary embodiment of the present invention. FIG. 19 illustrates an example of calculating a sliding distance of a pad node over a wafer surface according to an exemplary embodiment of the present invention. FIG. 20 illustrates an example of calculating an angle corresponding to a movement of node coordinates according to an exemplary embodiment of the present invention. FIG. 21 illustrates an image of a report on a wafer sliding distance distribution analysis performed by a pad of a "Wafer by Pad" type according to an exemplary embodiment of the present invention. FIG. 22 illustrates a graph showing changes in a wafer surface polishing speed according to an exemplary embodiment of the present invention. FIG. 23a and FIG. 23b illustrate trajectories drawn by nodes positioned on the wafer according to an exemplary embodiment of the present invention. FIG. 24a and FIG. 24b illustrate trajectories drawn by nodes positioned on the wafer according to another exemplary embodiment of the present invention. FIG. 25a illustrates a sliding distance maximum vector according to an exemplary embodiment of the present invention. FIG. 25b illustrates a flow chart showing a process of generating a sliding distance maximum vector according to an exemplary embodiment of the present invention. FIG. 26a illustrates a sliding distance vector distribution according to an exemplary embodiment of the present invention. FIG. 26b illustrates a flow chart showing a process of generating a sliding distance vector distribution according to an exemplary embodiment of the present invention. FIG. 27a illustrates a sliding vector deviation according to an exemplary embodiment of the present invention. FIG. 27b illustrates a flow chart showing a process of generating a sliding vector deviation according to an exemplary embodiment of the present invention. FIG. 28 illustrates an image of a report on a "Wafer by Pad" type wafer sliding distance distribution analysis performed by a pad adopting rectangular groove patterns according to an exemplary embodiment of the present invention. FIG. 29 illustrates an example of a distribution status of chip dies on a wafer and a chip die number according to an exemplary embodiment of the present invention. FIG. 30a illustrates a position of chip die Number 29 shown in FIG. 29 from the report on the "Wafer by pad" type wafer sliding distance distribution analysis. FIG. 30b illustrates an enlarged image of a sliding distance distribution of chip die Number 29 indicated in FIG. 29 and FIG. 30a. FIG. 31 illustrates an image of a report on a pad sliding distance distribution analysis performed by a wafer of a "Pad by Wafer" type according to an exemplary embodiment of the present invention. FIG. 32 illustrates an image of a report on a pad sliding distance distribution analysis performed by a conditioner of a "Pad by Conditioner" type according to an exemplary embodiment of the present invention. FIG. 33 illustrates an image of a report on a conditioner sliding distance distribution analysis performed by a pad of a "Conditioner by Pad" type according to an exemplary embodiment of the present invention. FIG. 34 illustrates a flow chart showing a process for deriving an effective sliding distance of a wafer according to an exemplary embodiment of the present invention. FIG. 35 illustrates a correlated flow chart of analyzing pad condition degradation and pad condition recovery according to an exemplary embodiment of the present invention.

Referring to FIG. 2, the polishing behavior analysis device 100 selects at least one element as an analysis target in accordance with a user input (S101) and then defines each of an equipment shape variable, an operation variable (process definition variable), and a calculation variable for each of the selected elements (S103, S105, and S107). At this point, each of the equipment shape variable, the operation variable (process definition variable), and the calculation variable reflects interaction between each of the elements. And, in case only one element is selected as the analysis target, the operations and shapes of elements of the target of sliding may be defined by being included in the shape variables and operation variables of the selected element.

For example, since the wafer and the pad interact with one another, variables related to any one of the wafer and the pad may be defined. Evidently, variables related to both the wafer and the pad may also be defined. Herein, in case of defining variables only for the wafer, the equipment shapes and operation variables of the pad, which corresponds to the target on which the wafer performs abrasion, may be defined by being included in the equipment shapes and operation variables of the wafer (evidently, the equipment shapes and operation variables of the pad may also be independently defined). If all of the equipment shape variables, the operation variables (process definition variables), and the calculation variables are set up, the polishing behavior analysis device 100 generates calculation nodes based on the configured content (S109).

The polishing behavior analysis device 100 performs a calculation in accordance with designated options (S111). Herein, the calculation uses a node of A, which corresponds to a calculation node generated in S109, in order to calculate the sliding distance between A and B and the accumulated movement vector.

The polishing behavior analysis device 100 analyzes statistical calculations, images of sliding distance distribution, images/moving picture images of trajectory calculation, vector graphs, and so on, based on the calculation results, which are obtained in step S111, and outputs the analyzed results (S113). Thereafter, the analyzed data are stored (S115).

Hereinafter, each process step will be described in detail.

Each of the variables that are defined in step S101 to step S107 may be directly designated or the designated content may be stored or loaded during the simulation step.

Herein, the step of selecting an element (S101) corresponds to a step of selecting one or more calculation objects among the elements configuring the polishing device. And, the step of defining equipment shape variables (S103) corresponds to a step of defining diverse variables associated with non-operating elements, which configure the one or more selected calculation objects. More specifically, the step of defining equipment shape variables (S103) corresponds to a step of defining as many variables as possible while considering the interaction between the calculation object and the sliding surface.

At this point, by reflecting the range of analysis of the selected calculation object, the interaction between the elements configuring the polishing device, and the geometric shapes, a structure of kinematic analysis is defined.

Table 1 represents equipment shape variables of a pad and a platen.

TABLE 1

| Configuration Elements | | Kinematic Definition | Basic shape variables |
|---|---|---|---|
| Platen and Pad | Pad | Pad on platen, circular disc | Outer diameter |
| | | | Inner diameter (When 0: Circular type pad, When more than 0, Ring type pad) |
| | | Conveyor belt type pad | Pad width |
| | | | Pad length (continuous length of the belt) |
| | Number of heads per dad | | Number of heads being installed to 1 pad |
| | Groove Patterns | Concentric circle | Land width |
| | | | Center coordinates of circle |
| | | | Groove width |
| | | Linear type | Land width |
| | | | Groove width |
| | | | Coordinates of pattern start point |
| | | | Angle (pattern angle) |
| | | Rectangular type | Vertical length of rectangular land |
| | | | Horizontal length of rectangular land |
| | | | Groove width (Horizontal/Vertical) |
| | | | Standard coordinates of rectangular land |
| | | | Angle |
| | | Wave forms, radial forms, and other indeterminate forms | Pattern equation or pattern form drawing data |

In Table 1, which is presented above, the equipment shape variables of a pad and a platen includes geometric shape types and basic shape variables of a pad and a platen, a number of heads per pad, and form types and basic shape variables of groove patterns.

The geometric shape types of the pad may include a circular pad or a belt type pad. The pad includes a circular disc shape positioned on a platen. Herein, the pad may correspond to a ring-type (doughnut type) pad 200, as shown in FIG. 3*a*, or the pad may correspond to a disc-type circular pad 200', as shown in FIG. 3*b*. In case of the ring-type pad, the basic shape variables include an outer diameter and an inner diameter.

Additionally, as shown in FIG. 4, the pad may correspond to a belt-type pad 200". The belt-type pad 200" may correspond to a conveyor belt shape, and the basic shape variables may include a pad width and a pad length.

Additionally, referring to FIG. 5, 4 heads may be installed in 1 pad, and 6 wafers may be installed in 1 head. In this case, the number of equipment shape variables may be set to 4. The number of heads being installed to 1 pad may be equal to 1 or more (i.e., a plurality of heads may be installed to 1 pad), and the number of equipment shape variables may be configured to correspond to the number of heads being attached to the pad.

Also, the forms of the groove patterns may include groove patterns of a concentric circle, as shown in FIG. 6*a*, groove patterns of a linear form, as shown in FIG. 6*b*, and groove patterns of a rectangular form, as shown in FIG. 6*c*. Furthermore, the forms of the groove patterns may also include wave forms, radial forms, and other indeterminate forms. In case the groove pattern form is configured of a concentric circle, the basic shape variables may include a land width, a groove width, and coordinates of the concentric circle. In case the groove pattern form is configured of a linear form, the basic shape variables may include a land width, a groove width, coordinates of a pattern start point, and a pattern angle. In case the groove pattern form is configured of a rectangular form, the basic shape variables may include a vertical length of a rectangular land, a horizontal length of a rectangular land, and standard coordinates of a rectangular land. In case the groove pattern form is configured of wave forms, radial forms, and other indeterminate forms, since the groove patterns cannot be expressed in equations, values that are calculated by the groove patterns by using a pattern shape drawing for the corresponding form may be set as the basic shape variables.

Table 2 represents equipment shape variables of a head.

TABLE 2

| Configuration Elements | Kinematic Definition | | Basic shape variables |
|---|---|---|---|
| Head | Head disc | | Head diameter |
| | Number of wafers per head | | Number of wafers being installed to 1 head |
| | Head sweep | Linear sweep | Distance between head center and pad center Position angle with respect to pad coordinate system Sweep angle |
| | | Swing arm sweep | Swing arm center x, y Swing arm length Swing arm initial angle |
| | Planetary gear head | | Sun gear teeth Planetary gear teeth Carrier gear teeth |
| | Other type head | | Guide roller head, and so on, by rotating sliding force (or friction force) of pad |

Referring to Table 2, the equipment shape variables of a head include a head diameter of a head disc, a number of wafers installed to 1 head, a head sweep, a planetary gear head, and other type heads. Referring to FIG. 7, the drawing represents a case when 1 wafer is installed to 1 head disc, and, in this case, the head diameter is set as a basic shape variable. Referring to FIG. 8a, the drawing represents a case when 3 wafers are installed to 1 head, and, referring to FIG. 8b, the drawing represents a case when 6 wafers are installed to 1 head.

Referring to FIG. 9, the drawing represents an example of determining a head position by linear sweep. The equipment shape variables of the linear sweep include a distance between a head center and a pad center, a position angle corresponding to a pad coordinate system, and a sweep angle. In FIG. 9, within the pad coordinate system, both the position angle and the sweep angle of the head are equal to 0 degree (0°).

Referring to FIG. 10, the drawing represents an example of determining a head position by swing arm sweep. The equipment shape variables of the swing arm sweep include a swing arm center x and y, a swing arm length, and a swing arm initial angle (swing arm init angle).

Referring to FIG. 11, the equipment shape variables of the planetary gear head include a sun gear, a planetary gear, and a carrier gear.

Table 3 represents equipment shape variables of a wafer.

TABLE 3

| Configuration Elements | Kinematic Definition | | Basic shape variables |
|---|---|---|---|
| Wafer | Wafer disc | | Wafer diameter |
| | Wafer position on head | | Distance between wafer center and head center Position angle with respect to head coordinate system |
| | Flat or Notch | Flat | Number of flats Flat distance Angle |
| | | Notch | Depth Position angle CCW angle CW angle Inner R (Notch peak R) |

Referring to Table 3, the equipment shape variables of a wafer include a wafer diameter of a wafer disc, a position of a wafer within a head, a flat, and a notch. Referring to FIG. 12, the drawing represents equipment shape variables of wafer coordinates. Herein, the basic shape variables of the wafer position include a distance between the wafer center and the head center, and a wafer position angle within a head coordinate system. Referring to FIG. 13, the drawing represents equipment shape variables of a wafer flat. Herein, the basic shape variables of the wafer flat include a number of flats, a distance between flats (flat distance), and a flat angle. Referring to FIG. 14, the drawing represents equipment shape variables of a wafer notch. Herein, the basic shape variables of the wafer notch include a notch depth, a position angle, a CCW angle, and a CW angle, as shown in FIG. 14a, and the basic shape variables of the notch include an Inner R (notch peak R), as shown in FIG. 14b.

Table 4 represents equipment shape variables of a conditioner.

TABLE 4

| Configuration Elements | Kinematic Definition | | Basic shape variables |
|---|---|---|---|
| Conditioner | Conditioner | Bar type | Horizontal length Vertical length |
| | | Circular type or ring type | Outer diameter Inner diameter (When 0: Circular type pad, When more than 0, Ring type pad) |
| | Conditioner sweep | Linear sweep | Distance between conditioner center and pad center Position angle with respect to pad coordinate system Sweep angle |
| | | Swing arm sweep | Swing arm center x, y Swing arm length Swing arm initial angle |
| | Groove | Concentric circle | Land width Center coordinates of circle Groove width |
| | | Linear type | Land width Groove width Coordinates of pattern start point Angle (pattern angle) |
| | | Rectangular type | Vertical length of rectangular land Horizontal length of rectangular land Groove width (Horizontal/Vertical) Standard coordinates of rectangular land Angle |
| | | Wave forms, radial forms, and other indeterminate forms | Pattern equation or pattern form drawing data |

Referring to FIG. 15a, in case the conditioner corresponds to a bar type, the equipment shape variables include a horizontal length variable and a vertical length variable. And, referring to FIG. 15b, in case the conditioner corresponds to a ring type, the equipment shape variables include an outer diameter and an inner diameter. And, referring to FIG. 15c, the equipment shape variables include an outer diameter.

The equipment shape variables of the linear sweep include a distance between a conditioner center and a pad center of the linear sweep, a position angle corresponding to a pad coordinate system, and a sweep angle. This is similar to the case of the head sweep shown in Table 2. Also, the equipment shape variables of the swing arm sweep include a swing arm center x and y, a swing arm length, and a swing arm initial angle. This is similar to the case of the head swing arm sweep shown in Table 2.

The groove patterns of the conditioner are similar to the groove patterns of the head, which is shown in Table 1.

The step of defining equipment operation variables (S105) corresponds to a step of defining diverse variables associated with the operations of the elements configuring the polishing device, such as the pad, the head, the wafer, the conditioner, and so on. More specifically, the step of defining the equipment operation variables (S105) corresponds to a step of defining as many variables as possible based on the operation of the selected elements. The equipment operation variables are defined by implementing a movement equation reflecting mechanical operations, and such operation variables may include rotation of a pad and a platen (rotation of a belt in case of a belt-type), rotation and sweep (linear/swing arm) of a head, and rotation and sweep (linear/swing arm) of a conditioner.

TABLE 5

| Configuration Elements | | Kinematic Definition | Operation variables |
|---|---|---|---|
| Platen and Pad | Pad or polishing surface | Pad on platen, Circular disc | Rotation speed Rotation direction Initial position angle |
| | | Conveyor belt type pad | Rotation speed Initial position |
| Head | Head disc | | Rotation speed Rotation direction Initial position angle |
| | Head sweep | Sweep speed | Sinusoidal sweep speed Change in speed for each section Other speed functions |
| | | Linear sweep | Sweep reciprocation distance |
| | | Swing arm sweep | Swing arm sweep angle (Reciprocation angle) |
| | Planetary gear head | | Sun gear teeth rotation speed Planetary gear teeth rotation speed Carrier gear teeth rotation speed |
| | Other type head | | Speed of operation according to other head type is defined |
| Wafer | Wafer disc Wafer position on head | | Wafer operations are dependent to head |
| | Flat or Notch | Flat Notch | |
| Conditioner | Conditioner shape | Bar type | The bar type performs only sweep |
| | | Circular type or ring type | Rotation speed Rotation direction Initial position angle |
| | Conditioner sweep | Sweep speed | Sinusoidal sweep speed Change in speed for each section Other speed functions |
| | | Linear sweep | Sweep reciprocation distance |
| | | Swing arm sweep | Swing arm sweep angle (Reciprocation angle) |

In Table 5, a sweep speed is as shown in FIG. 16. Referring to FIG. 16a, the drawing illustrates a sinusoidal sweep speed. Herein, a sine (Sin) function indicates a position value, and a cosine (Cos) function indicates a speed value. Referring to FIG. 16b, the drawing illustrates a speed step sweep function.

The step of defining calculation variables (S107) corresponds to a process of configuring (or setting up) a resolution for calculating polishing behavior. More specifically, the step of defining calculation variables (S107) corresponds to a step of defining calculation variables for performing calculation by generating a calculation model by using the equipment shape variables and the operation variables. Herein, the calculation variables include unit calculation time intervals, a node generating resolution of a calculation model. Herein, the unit calculation time should be determined based on the geometric size and movement equation of the elements. The calculation variables will hereinafter be presented in Table 6 shown below.

TABLE 6

| Category | Configuration Elements | Kinematic Elements | | Calculation Variables |
|---|---|---|---|---|
| Main calculation variables | NA | | | Calculation time intervals |
| Calculation resolution of device configuration elements | Pad Head Wafer Conditioner | Method for generating calculation nodes | Cartesian coordinate system node Circular coordinate system node | Calculation node resolution (mm) Calculation node resolution (degree) |

Referring to Table 6, the calculation variables includes main calculation variables and a calculation resolution of the device configuration elements. The main calculation variables include calculation time intervals. Since the calculation time intervals determines calculation unit resolution based on the rotation or movement speed of each element (or configuration element), the calculation time interval should be sufficiently short. For example, in case of circular movements, if the calculation is carried out at a rotation speed of 60 rpm at an interval of 0.1 second, the calculation angle becomes equal to an interval of 36 degrees (36°). Accordingly, since a significant difference occurs in the travel distances (or movement distances) per unit time between a central part and an outer part (or external part) of a circular element, definition should be performed based on such a characteristic. In the present invention, there is no limitation in a minimum value for calculation time interval precision.

Additionally, the calculation nodes of configuration elements of the pad, the head, the wafer, and the conditioner may be generated in the cartesian coordinate system. In the cartesian coordinate system, the calculation node resolution (mm) may be configured as the calculation variables.

Moreover, the calculation nodes of configuration elements of the pad, the head, the wafer, and the conditioner may be generated in the circular coordinate system. In the circular coordinate system, the calculation node resolution (degrees) may be configured as the calculation variables. Herein, for generating nodes, resolution and coordinate system that can sufficiently reflect the shape of the corresponding configuration element should be used, and one of the cartesian coordinate system node and the circular coordinate system node may be selected in accordance with the data that are required.

At this point, a calculation option may be additionally set up (or configured). The calculation option may include selection of one of multiple calculation methods, data storage option set-up (or configuration), and parallel processing condition set-up (or configuration). Herein, the selection of one of multiple calculation methods corresponds to an option for selecting whether to perform calculation for a basic accumulated sliding distance only, or whether to consider pressure distribution, conditioner recovery, pad condition degradation, and so on. During the calculation process, data are stored, and, in order to store such data as image, the data are required to be stored during the calculation. The data storage option set-up (or configuration) corresponds to an option for such an intermediate storage process. The parallel processing condition set-up (or configuration) corresponds to an option for setting up (or configuring) a condition for performing the arithmetic operation by using multiple processing devices (CPUs or GPUs).

If all of the equipment shape variables, the operation variables (process definition variables), and the calculation variables are set up, the polishing behavior analysis device 100 generates calculation nodes based on the configured (or set-up) content (S109). When the user inputs a <Start calculation> command (or instruction) through an input device, the polishing behavior analysis device 100 stores all of the configured options and initiates the calculation node generation process.

At this point, the polishing behavior analysis device 100 generates the calculation nodes by using the resolution designated by the configured calculation variables. This is performed as shown in FIG. 17. For example, when the cartesian coordinate system nodes are generated at an interval of 1 mm on a circular pad disc having a wafer diameter of 256 mm, a total of 50,256 nodes are configured. When configuring the calculation nodes of a configuration element, the geometric shape of the element should be accurately reflected. The nodes are not generated in groove parts of the pad and the conditioner, and the shapes of the flat and notch of the wafer are required to be reflected (or applied).

The polishing behavior analysis device 100 performs calculation in accordance with the designated options (S111). Herein, this process step calculates a sliding distance between A and B and the accumulated movement vector by using a node of A, i.e., a calculation node that is generated in step S109.

At this point, 4 different types of calculation may be performed as described below. A first type corresponds to "Wafer by Pad". In this case, A corresponds to the wafer, and B corresponds to the pad.

Herein, the sliding distances, which are scratched by the pad and recorded to each point of wafer shape node data, may be defined as the wafer sliding distance, and other sliding distances may also be calculated in accordance with relative sliding distances caused by two different surfaces. A second type corresponds to "Pad by Wafer". In this case, A corresponds to the pad, and B corresponds to the wafer. A third type corresponds to "Conditioner by Pad". In this case, A corresponds to the conditioner, and B corresponds to the pad. And, a fourth type corresponds to "Pad by Conditioner". In this case, A corresponds to the pad, and B corresponds to the conditioner.

The method of calculating a sliding distance between A and B and the accumulated movement vector by using a node of A, which is performed by the polishing behavior analysis device 100, is as shown in FIG. 18. Each process step of FIG. 18 is applied to all of the 4 different calculation types, which are described above.

Referring to FIG. 18, the polishing behavior analysis device 100 configures an end time (or accumulated time) (t_current=t_before+Δt) for the calculation (S201).

Thereafter, when selecting a calculation node of Model A, which corresponds to the above-mentioned "A", the polishing behavior analysis device 100 selects one node (Node_i=Node_0~Node_n) among the calculation nodes of Model A among the N number of configuration element nodes (S203).

Afterwards, the polishing behavior analysis device 100 generates coordinates defining data (coordinate P1) corresponding to the accumulated time (t_before) of the calculation node (node_i) (S205).

Subsequently, the polishing behavior analysis device 100 calculates a node movement coordinates (P2) corresponding to the accumulated time (t_current) according to the time resolution (S207). Herein, the movement equation for each model element is applied. More specifically, movement coordinates for each unit time of all calculation nodes belonging to the configuration elements are calculated by using the above-described movement equation in accordance with the time of the configuration elements. This movement equation may vary in accordance with a kinematic mechanism of each configuration element and may be indicated as an equation for complex coordinates calculation, which includes rotating motions and linear motions.

Afterwards, a P1-P2 vector is generated based on each of the generated coordinates (P1, P2) (S209). Thereafter, data of the P1-P2 vector are calculated (S211).

Meanwhile, it is determined whether or not a boundary of Model B exists between P1-P2 (S213). At this point, if the boundary of Model B does not exist, the travel distance (or movement distance) P1-P2 of the node is calculated as the sliding distance of the node (S215). However, if the boundary of Model B exists, dividing is performed by using the boundary of Model B existing between P1-P2 (S217), and, then, the travel distance (or movement distance) corresponding to the inside of Model B between the divided P1-P2 is calculated as the sliding distance of the model node (S219).

Subsequently, a distance traveled by the calculation node of Model A over a surface of Model B is calculated as the sliding distance (S221). Then, the accumulated data for each node and the accumulated data for each sliding angle are calculated (S223).

After determining whether or not the node calculation is completed (S225), if the node calculation is not completed, the procedure returns to step S203. Conversely, if the node calculation is completed, it is determined whether or not an end time is reached (S227). If the end time is not reached, after increasing the elapsed time (S229), the procedure returns to step S201. However, in case the end time is reached, the accumulated sliding distance calculation is completed (S231).

Herein, when calculating the sliding distance, the sliding distance between the configuration elements is calculated in accordance with the relationship between each of the configuration elements within the distance between movements of unit time coordinates (P2). At this point, the shapes of each configuration element and all geometric factors on the surface should be considered. The factors that should be considered may include exemplary shapes of the pad, exemplary grooves of the surface (or land), the wafer notch, and the wafer flat. This is shown in FIG. 19. Herein, FIG. 19 illustrates an example of calculating a sliding distance of a pad node, which is scratched by the pad.

Also, the friction between the wafer and the pad is generated due to relative motions between each of the configuration elements. And, at this point, a direction of the friction influences the patterns that are printed on the wafer.

According to the exemplary embodiment of the present invention, in the calculation result for each unit time, when calculating coordinates corresponding to each node, by calculating and storing a direction vector along a straight line between the coordinates, an accumulated sliding distance for each angle or an accumulated level of polishing that applies variables related to the polishing environment may be calculated in accordance with a result, which is calculated up to a final elapsed time. At this point, the calculated angles may be designated to have random intervals of 0.1, 1, 5, 10, 20 degrees, and so on, and may be stored accordingly. This is shown in FIG. 20. More specifically, in this drawing, the angle calculation respective to the coordinate movement is performed by comparing a vector, which results from a node coordinate movement, with a coordinate system standard vector. As described above, the calculation result is indicated as an image showing accumulated distribution along the polishing direction, which corresponds to each node. A vector distribution chart may be analyzed by using diverse data, such as sliding distance, standard deviation of sliding distance, difference between the maximum and minimum values.

After calculating the coordinates that have moved during a unit time for all of the calculation nodes of the configuration elements, the calculated coordinates are used for calculating the actual sliding distance. Since the movement distance between coordinates P1-P2 only considers a change in the coordinates, in order to calculate the relative sliding distance, the actual sliding distance is calculated based on the surface condition and shape of a counterpart sliding configuration element, which is then calculated as an accumulated value of the corresponding node. Herein, a groove of the pad, a flat of the wafer, a notch of the wafer, and so on, are considered.

The calculated sliding distance and polishing direction, i.e., movement angle, are stored as accumulated vector data of the corresponding node. The movement angle refers to an angle between a reference vector and the P1-P2 movement vector. The accumulated vector may be applied to all calculation values, such as level of polishing, level of pad condition degradation, level of pad condition recovery performed by the conditioner, and so on, which will be described later on in the processing example, in addition to the sliding distance. Herein, however, during each of the calculation process steps, the direction vector should be calculated and the corresponding calculation data should then be stored. As a method for expressing the accumulated vector, diverse arithmetic operations may be performed, such as angle distribution (maximum/minimum/average/deviation) for each node, maximum/minimum/average/deviation values for all nodes of the corresponding configuration element, and so on. After calculating an accumulated sliding distance and an accumulated vector by using the movement of the coordinates corresponding to each node, this process is repeated at each unit time until an end time is reached. For example, in order to calculate a quantity of change during 1 second at an interval of 0.01 second, the above-described process is repeated 100 times.

The calculated result data may exist in the form of coordinates values and sliding distance values of the nodes or in the form of data corresponding to angles. And, such data may be stored in files or may be indicated as image graphs. Alternatively, such data may be processed as diverse forms of image graphs or time-based moving picture images.

Subsequently, the polishing behavior analysis device 100 performs numerical analysis of the calculated results or may generate the analyzed results in the form of images, moving picture images, and so on. Diverse additions may be made in accordance with the analyzation options. At this point, statistical calculations, sliding distance distribution images, trajectory calculation images and moving picture images, vector graphs, and so on, may be outputted to a screen and may be stored as files, and such data are stored.

During the numerical analysis of the calculation results, the wafer uses statistical numerical analysis. Herein, the accumulated sliding distance, the maximum accumulated sliding distance, the minimum accumulated sliding distance, and the average accumulated sliding distance may be analyzed. In addition to the maximum/minimum/average values, diverse statistical numerical analysis, such as standard deviation, distribution, and so on, may be performed. At this point, according to an exemplary embodiment of the present invention, [Sliding distance deviation (%)] or [Nonuniformity of sliding distance distribution (%)] may be calculated as [(Maximum sliding distance Minimum sliding distance)/((Maximum sliding distance+Minimum sliding distance)/2)×100]. According to another exemplary embodiment of the present invention, the sliding distance deviation (%) may be calculated as [(Maximum sliding distance Minimum sliding distance)/(Total sum of sliding distances for each node/number of nodes)×100]. According to yet another exemplary embodiment of the present invention, the sliding distance deviation (%) may be calculated as [Standard deviation of node sliding distances/an average of node sliding distances (Total sum of sliding distances for each node/number of nodes)×100]. And, according to yet another exemplary embodiment of the present invention, the sliding distance deviation (%) may be calculated as [(1−Minimum sliding distance/Maximum sliding distance)×100].

Additionally, during the numerical analysis of the calculation results, the wafer result analysis of the "Wafer by Pad" type may be outputted in the form of a sliding distance distribution image, as shown in FIG. 21.

Also, in addition to a fixed image, the analysis result may also be expressed as a moving picture image showing the process of change, an image or moving picture image showing a trajectory by selecting only a predetermined number of nodes, and so on.

A change in the sliding speed is indicated in the form of a graph according to a time axis. Herein, a sliding distance occurring during a desired time is divided in accordance with one unit time (sec) and the respective change values are indicated. As shown in FIG. 22, a change in the polishing speed of the wafer surface nodes may be indicated. Referring to FIG. 22, as an analysis in a speed change of a P60/H30 condition, the maximum value of the polishing speed of a point is almost 2 times greater than the minimum value, and a difference in the polishing speed between the same wafer surface node is also approximately 20%. The difference in the polishing speed between multiple points is similar to a difference in the sliding distance.

Additionally, a "Wafer by Pad" trajectory indication corresponds to a trajectory indication on how the points marked on the wafer pass the surface of the pad. FIG. 23a and FIG. 23b illustrate trajectories drawn by nodes positioned on the wafer. This example corresponds to an image, wherein coordinates of the pad are fixed. Most particularly, FIG. 23a illustrates trajectory tracking nodes on an x-axis, and FIG. 23b illustrates tracking results after 0.5 second.

FIG. 24a and FIG. 24b illustrate trajectories drawn by nodes positioned on the wafer. This example corresponds to an image, wherein coordinates of the machine, i.e., polishing device are fixed. Most particularly, FIG. 24a illustrates trajectory tracking nodes on an x-axis, and FIG. 24b illustrates tracking results after 0.5 second.

As described above, image forms vary in accordance with a fixed reference of the coordinate system.

During the numerical analysis of the calculation results, "Wafer by Pad" analyzes a sliding direction vector of the wafer. And, herein, FIG. 25a illustrates a maximum vector of the sliding distance. The maximum vector of the sliding distance indicates only the vectors having maximum values for each node within the vector data stored in each node. Arrows marked on the graph indicate the direction of the longest sliding distance of the corresponding node position.

Referring to FIG. 25b, the polishing behavior analyzing device 100 selects calculation nodes of Model A (S301). Then, the polishing behavior analyzing device 100 selects one of the indicated nodes (S303). At this point, a vector indication interval option may be configured. The polishing behavior analyzing device 100 extracts a vector having a maximum value of accumulated sliding distance from the designated node (S305). Thereafter, step S301 to step S307 are repeated until the node calculation is completed. When the node calculation is completed, a graph indicating the results at designated node positions along the maximum vector value direction, i.e., a graph indicating the maximum vector of the sliding distance, as shown in FIG. 25a, is generated (S309).

Referring to FIG. 26a and FIG. 26b, when indicating the sliding distance vector distribution, a color is determined in the vector data of each node for the sliding distance of each vector of the entire nodes included in the corresponding model. Herein, the color Red indicates a direction according to which the sliding distance is long with respect to the entire nodes of the corresponding model, and the color Blue indicates a direction according to which the sliding distance is short with respect to the entire nodes of the corresponding model. In the graph shown in FIG. 26a, the same color indication value of different nodes indicates the accumulated sliding distance belonging to the same range, i.e., the same contour band. Herein, the black arrows overlay with the graph indicating the maximum vector of the sliding distance shown in FIG. 25a.

Referring to FIG. 26b, the polishing behavior analyzing device 100 selects a calculation node of Model A (S401). Then, the polishing behavior analyzing device 100 extracts accumulated values of all of the vector elements and sorts the extracted values (S403). At this point, a vector indication interval option may be configured. The polishing behavior analyzing device 100 determines a contour color in accordance with the range of the accumulated values (S405). Thereafter, the polishing behavior analyzing device 100 re-allocates the color values, which are determined in step S405, to the vector data of each node (S407). Afterwards, the polishing behavior analyzing device 100 generates a graph indicating vector data by using the allocated colors at the corresponding node positions (S409).

FIG. 27a and FIG. 27b, a vector deviation is indicated in colors after calculating a deviation (%) respective to each vector direction for each 1 node. Herein, the following calculation is performed: [deviation (%)=(Sliding distance value of 1 vector direction of the corresponding node)/(Maximum sliding distance vector value of the corresponding node)×100]. The vector deviation value is calculated and indicated for each node. The sliding distance values of the Red vector of Node_i and the Red vector of Node) are not identical to one another. However, this indicates that the sliding distance value of the Red vector is more than 90% of the maximum direction vector of the corresponding node.

Referring to FIG. 27b, the polishing behavior analyzing device 100 selects a calculation node of Model A (S501). Then, the polishing behavior analyzing device 100 selects a designated node (S503). At this point, a vector indication interval option may be configured. The polishing behavior analyzing device 100 extracts a maximum value, i.e., accumulated sliding distance, from the designated node (S505). Subsequently, the polishing behavior analyzing device 100 calculates data deviation for each angle of the corresponding node with respect to the maximum value of the corresponding node, i.e., the designated node (S507). Thereafter, the polishing behavior analyzing device 100 allocates colors (or color indicators) to the angle data for each node in accordance with the calculated deviation (S509). After determining whether or not the node calculation is completed (S511), step S501 to step S511 are repeated until the node calculation is completed. After completing the node calculation, a graph indicating vector data by using the allocated colors at the corresponding node positions is generated, as shown in FIG. 27a, (S513).

Calculation results of a wafer surface while considering the grooves that are formed on the pad surface may vary depending upon the groove patterns in the pad. FIG. 28 illustrates an image of a wafer sliding distance distribution analysis corresponding to a polishing process that is performed on a wafer surface by a pad having a rectangular groove, as shown in FIG. 6(c). In case grooves exist in the pad, the wafer sliding distance distribution varies in accordance with the form of the grooves, and the change in the sliding distance caused by the grooves may be calculated by using the calculation method according to the present invention.

FIG. 29 illustrates an example of a distribution status of chip dies on a wafer and a chip die number according to an exemplary embodiment of the present invention. FIG. 30a illustrates a position of chip die Number 29 shown in FIG. 29 from the result of wafer sliding distance distribution analysis. FIG. 30b illustrates an enlarged image of a sliding distance distribution of chip die Number 29 indicated in FIG. 29 and FIG. 30a.

As shown in FIG. 29, the calculation result of the wafer surface may be indicated by being divided into chip die areas being printed on the wafer surface. A chip die corresponds to a basic unit of a semiconductor chip, which is fabricated by using a wafer, and a plurality of chip dies exists in 1 wafer and 1 chip die is processed as 1 semiconductor chip. During the process of fabricating a semiconductor, since all of the semiconductor chips being fabricated on 1 wafer should be uniformly processed, if the calculation result is divided into multiple chip die areas, as shown in FIGS. 30a and 30, comparison may be made between processing results of each chip die, which is then applied to the fabrication process.

The calculation of the pad sliding distance of the "Pad by Wafer" type may be used as a method for comparing pad polishing uniformity, which is caused by the result of a polishing process with different operating conditions in other polishing devices, by using a wafer normalized maximum sliding distance, which is obtained by normalizing the accumulated sliding distance of the pad to a wafer sliding distance and surface area caused by the same pad, and an effective polishing surface area. The pad surface analysis graph is shown in FIG. 31. Herein, FIG. 31 illustrates a pad sliding distance distribution contour graph. Herein, the surface sliding (or surface friction) of the wafer is evidently caused by the pad. However, the surface sliding (or surface friction) of the pad is caused by the wafer and the conditioner, and the corresponding sliding results are different from one another. This is shown in FIG. 32 and FIG. 33. Herein, FIG. 32 illustrates a pad sliding distance caused by a conditioner, and FIG. 33 illustrates a conditioner sliding distance caused by a pad.

Just as the relationship between the wafer and the pad, the conditioner and the pad basically calculate the sliding distance as well. A pad sliding distance caused by the conditioner recovers the condition of the pad that is worn out (or lost by abrasion) due to the polishing of the wafer. Therefore, a pad sliding distance caused by the conditioner may be used for calculating (or predicting) the status of a pad condition during the polishing process.

Even when performing analysis of the pad sliding distance caused by the wafer, analysis of the pad sliding distance caused by the conditioner, and analysis of the conditioner sliding distance caused by the pad, it will be apparent that the same sliding direction vector analysis of the "Wafer by Pad" type may be performed.

Meanwhile, the polishing behavior analyzing device 100 expands its sliding distance analyzing function and may additionally include 1) a function of analyzing pad condition degradation caused by the wafer, 2) a function of analyzing pad condition recovery performed by the conditioner, 3) a function analyzing other wafer characteristics data in addition to the effects of wafer pressure distribution and the partial wafer polishing characteristic, and a function of analyzing pad characteristics data in addition to the effects of polishing liquid supply on the pad surface and pad surface temperature, and 4) a function of simulating a change in the wafer polishing characteristic according to a long-term usage of the pad.

The level of polishing of the wafer is proportional to the sliding distance caused by the pad. The level of polishing of the wafer performed by the pad varies in accordance with a pad surface condition, supply condition of the polishing liquid, pressure applied to the wafer by the head, and so on. And, the effects of such variables may be applied to the sliding distance of the wafer caused by the pad and may then be calculated.

A wafer effective sliding distance corresponds to a value that is calculated by applying the effects of the pad condition and the polishing liquid, the effects of the pad surface temperature, the effects of the pressure applied to the wafer, the partial wafer polishing characteristic, and so on, to the accumulated sliding distance of the wafer. And, this value corresponds to a physical quantity that is adopted in order to calculate the actual level of wafer polishing from the accumulated sliding distance. This physical quantity may also be calculated by other diverse conditions apart from the conditions listed above. And, therefore, the conditions that are inputted in order to deduce the above-described physical quantity will not be limited only to the conditions listed above.

Abrasion occurs on the surface of the pad each time the pad polishes the wafer. And, the abrasion loss varies in accordance with the accumulated sliding distance between the pad and the wafer. At this point, the abrasion influences the pad conditions, which determines the polishing capability of the pad. Additionally, the conditioner also slides on the pad, which influences the pad condition by recovering the polishing capability of the pad. Therefore, the pad condition should be calculated based on both the accumulated sliding distance of the pad caused by the wafer and the sliding distance of the pad caused by the conditioner.

The effective sliding distance of the wafer, which considers other pad characteristics data including pad condition, polishing liquid supply condition, and influence of temperature, and other wafer characteristics data including pressure applied to the wafer and partial polishing characteristics of the wafer, is calculated as shown in FIG. 34, and each process step of FIG. 34 performs an end time repetition loop.

Referring to FIG. 34, it is apparent that the effective sliding distance of the wafer may be calculated by applying the other pad characteristics data including pad condition, polishing liquid supply condition, and the effects of temperature, and the other wafer characteristics data including pressure applied to the wafer and partial polishing characteristics of the wafer.

The polishing behavior analyzing device 100 selects a wafer node (S601). Then, the polishing behavior analyzing device 100 calculates fixed coordinates W1, which correspond to coordinates prior to the elapse of the accumulated time of the selected node, and node movement coordinates W2, which correspond to coordinates after the accumulated time, and calculates the accumulated sliding distance (S603). Thereafter, from a pad condition data map (S605), the polishing behavior analyzing device 100 imports condition data of pad coordinates P1 and P2 respective to the position of coordinates W1 and W2 (S607). Then, an average of pad conditions WP1 and WP2 are calculated from the imported data (S609). The average is applied to the calculation of the effective sliding distance (S611) along with an average of the other pad characteristics (S617), the data related to other variables of the selected wafer node (S621), and the accumulated sliding distance.

Additionally, from the other pad characteristics data map (S613), the polishing behavior analyzing device 100 imports data related to other variables of the pad coordinates P1 and P2 respective to the position of coordinates W1 and W2 (S615). An average of the data related to other variables WC1 and WC2 of the pad is calculated from the imported data (S617). The average is applied to the calculation of the effective sliding distance (S611) along with an average of the pad condition (S609), the data related to other variables of the selected wafer node (S621), and the accumulated sliding distance.

Furthermore, from the other wafer characteristics data map (S619), the polishing behavior analyzing device 100 imports the data related to other variables of the selected wafer node (S621). The average is applied to the calculation of the effective sliding distance (S611) along with an average of the pad condition (S609), an average of the other pad characteristics (S617), and the accumulated sliding distance.

The calculation of the effective sliding distance (S611) is calculated by applying all data related to the pad condition (S609), the average of the other pad characteristics (S617), and the data related to other variables of the selected wafer node (S621), and the equation for such calculation is determined by considering each of the data characteristics. After determining whether or not the entire nodes are repeated (S623), step S601 to step S623 are repeated. When the repetition of the entire nodes is completed, the calculation is repeated once again until an end time and effective sliding distance data of the wafer nodes corresponding to the end time are calculated (S625).

Referring to FIG. 35, a pad condition data map is calculated by using a correlation between a pad condition recovery performed by the conditioner while considering the abrasion loss of the conditioner and a pad condition degradation caused by the wafer. Thereafter, the calculated pad condition data map is applied to the calculation of the effective sliding distance of the wafer.

The polishing behavior analyzing device 100 selects a conditioner node (S701) and calculates a sliding distance of the corresponding node, which is scratched by the pad (S703). Then, by referring to the conditioner condition data map of a previous time (S711), a condition value of the conditioner condition value change caused by the sliding distance scratched by the pad is calculated (S705). After determining whether or not the entire nodes are repeated (S707), step S701 to step S707 are repeated. When the repetition of the entire nodes is completed, the condition data map of the conditioner nodes is updated (S709). The updated conditioner nodes are applied to the conditioner condition map after the elapse of a unit time (S711).

Additionally, the polishing behavior analyzing device 100 selects a pad node (S713) and calculates a sliding distance, which is scratched by the conditioner, of the selected node (S715). Then, the polishing behavior analyzing device 100 calculates a pad condition recovery value resulting from the conditioner sliding distance (S717) by applying a pad condition data map (S737) and the conditioner condition data map (S711). At this point, after determining whether or not the entire nodes are repeated (S719), step S713 to step S719 are repeated. Thereafter, when the repetition of the entire nodes is completed, the polishing behavior analyzing device 100 generates a pad condition recovery data map condition recovery data map, wherein the pad node is updated (S721). The generated pad condition recovery map is used for calculating pad condition data (S723) after the elapse of a unit time along with a pad condition degradation data map (S735).

Subsequently, the polishing behavior analyzing device 100 selects a pad node (S727) and calculates a sliding distance, which is scratched by the wafer of the selected node (S729). Thereafter, the polishing behavior analyzing device 100 calculates a pad condition degradation value resulting from the sliding distance (S731) by applying the pad condition data map (S737). After determining whether or not the entire nodes are repeated (S733), step S727 to step S733 are repeated. When the repetition of the entire nodes is completed, the polishing behavior analyzing device 100 generates a pad condition degradation data map resulting from the wafer sliding (or friction) of the pad node (S735). The generated pad condition degradation map is used for calculating pad condition data (S723) after the elapse of a unit time along with a pad condition recovery data map (S721).

After calculating the pad condition with degradation and recovery after the elapse of a unit time (S723), the polishing behavior analyzing device 100 updates the pad condition data map corresponding to the entire pad node (S725) and generates a new pad condition data map (S737). The pad condition data map is applied to the calculation of the effective sliding distance of the wafer (S739).

The above-described exemplary embodiment of the present invention will not be implemented only as a device and a method as presented herein. Therefore, it should be understood that the exemplary embodiment of the present invention may also be implemented in the form of a program realizing functions that correspond to the configuration of the exemplary embodiment of the present invention as well as in the form of a recording medium in which such program is recorded.

It will be apparent to those skilled in the art that various modifications and variations can be made in this specification without departing from the spirit or scope of this specification. Thus, it is intended that this specification covers the modifications and variations of this invention provided they come within the scope of the appended claims and their equivalents. It is also apparent that such variations of this specification are not to be understood individually or separately from the technical scope or spirit of this specification.

What is claimed is:

1. A method for analyzing polishing behavior of a device for analyzing polishing behavior by at least one processor, comprising:

setting up equipment shape variables, operation variables, and calculation variables corresponding to at least one configuration element being selected from one of a pad and a wafer, the pad and the wafer configuring a polishing device;

generating calculation nodes based on the equipment shape variables, the operation variables, and the calculation variables;

calculating a sliding distance on a wafer surface caused by the pad or a sliding distance on a pad surface caused by the wafer by using the calculation nodes;

outputting the calculated result; and performing uniform polishing on the wafer surface based on the calculated result, wherein the step of calculating a sliding distance comprises:

calculating each of fixed coordinates corresponding to coordinates before an elapse of accumulated time and node movement coordinates corresponding to coordinates after the accumulated time of a first calculation node, the first calculation node being selected from a plurality of nodes corresponding to a first configuration element among the selected configuration elements;

determining whether or not a boundary of a second configuration element among the selected configuration elements exists in a position between the fixed coordinates and the node movement coordinates;

if the boundary does not exist, calculating a distance travelled by the first calculation node between the fixed coordinates and the node movement coordinates, thereby computing the calculated travel distance as a sliding distance of the first calculation node; and if the boundary exists, computing a travel distance corresponding to an inner part of a second configuration element between the fixed coordinates and the node movement coordinates that are divided by the boundary, as a sliding distance of the first calculation node.

2. The method of claim 1, wherein the sliding distance is accumulated for each of a unit time, a plurality of calculation nodes, and a sliding angle, respectively.

3. The method of claim 2, wherein the sliding distance is calculated while considering pad groove patterns and a wafer flat or notch, respectively.

4. The method of claim 1, further comprising, after the step of calculating a sliding distance:

storing the sliding distance and movement angles indicating polishing directions as accumulated data for each of the calculation nodes.

5. The method of claim 1, wherein, in the step of outputting the calculated result, a sliding distance distribution image, a change in a sliding speed, and trajectory results of calculation nodes of the pad or wafer configuring the polishing device are provided in forms of numeric data, images or moving picture images.

6. The method of claim 5, wherein, in the step of outputting the calculated results, a graph is outputted, wherein the graph indicates a polishing direction having a longest sliding distance in vector data corresponding to each of the calculation nodes in forms of numeric data or vector.

7. The method of claim 5, wherein, in the step of outputting the calculated results, the sliding distance for each vector is indicated in the vector data corresponding to each of the calculation nodes by using numeric data or color indicators.

8. The method of claim 1, wherein, in the step of setting up equipment shape variables, operation variables, and calculation variables corresponding to at least one configuration element being selected from one of a pad and a wafer, the pad and the wafer configuring a polishing device, equipment shape variables, operation variables, and calculation variables corresponding to a head are additionally configured, and wherein the sliding distance is calculated by using the additionally configured variables.

9. The method of claim 1, wherein, in the step of setting up equipment shape variables, operation variables, and calculation variables corresponding to at least one configuration element being selected from one of a pad and a wafer, the pad and the wafer configuring a polishing device, equipment shape variables, operation variables, and calculation variables corresponding to a conditioner are additionally configured, and wherein a sliding distance of a conditioner caused by the pad or a sliding distance of a pad caused by the conditioner is calculated accordingly by using the calculation nodes.

10. The method of claim 1, wherein, in addition to the sliding distance, an item being calculated by using the calculation nodes is selected from at least one of an effective sliding distance and an accumulated movement vector.

11. A device for analyzing polishing behavior, comprising:
a memory storing a polishing behavior analysis program, wherein the polishing behavior analysis program is configured to provide a screen to a user allowing the user to input and/or to set up information on variables for analyzing polishing behavior, to analyze polishing behavior when a polishing device polishes a polishing target by using the information on the variables being inputted and/or set up by the user, and to output an analysis result; and
a processor executing the polishing behavior analysis program,
wherein the polishing behavior analysis program includes instructions for setting up equipment shape variables, operation variables, and calculation variables corresponding to at least one configuration element being selected from one of a pad and a wafer, the pad and the wafer configuring a polishing device, for generating calculation nodes based on the equipment shape variables, the operation variables, and the calculation variables, and for outputting results of calculating a sliding distance on a wafer surface caused by the pad or a sliding distance on a pad surface caused by the wafer by using the calculation nodes,
wherein the processor is configured to perform uniform polishing on the wafer surface based on the calculated results,
wherein the polishing behavior analysis program includes instructions for calculating each of fixed coordinates corresponding to coordinates before an elapse of accumulated time and node movement coordinates corresponding to coordinates after the accumulated time of a first calculation node, the first calculation node being selected from a plurality of nodes corresponding to a first configuration element among the selected configuration elements, and for determining whether or not a boundary of a second configuration element among the selected configuration elements exists in a position between the fixed coordinates and the node movement coordinates,
wherein, if the boundary does not exist, the polishing behavior analysis program includes instructions for calculating a distance travelled by the first calculation node between the fixed coordinates and the node movement coordinates, thereby computing the calculated travel distance as a sliding distance of the first calculation node, and, if the boundary exists, the polishing behavior analysis program includes instructions for computing a travel distance corresponding to an inner part of a second configuration element between the fixed coordinates and the node movement coordinates that are divided by the boundary as a sliding distance of the first calculation node.

12. The device of claim 11, wherein the polishing behavior analysis program generates data accumulating the sliding distance being calculated for each of a unit time, a plurality of calculation nodes, and a sliding angle, respectively, while considering pad groove patterns and a wafer flat or notch, respectively.

13. The device of claim 11, wherein the polishing behavior analysis program outputs at least one of a graph indicating numeric data of calculated sliding distances, changes in a sliding speed according to a time axis, trajectory results of calculation nodes corresponding to each of the pads and the wafers configuring the polishing device, and a direction having a longest sliding distance in vector data corresponding to each calculation node as a vector, and a graph differentiating the sliding distance for each vector in the vector data corresponding to each of the calculation nodes by using different colors, and indicating such differentiation.

14. The device of claim 11, wherein equipment shape variables, operation variables, and calculation variables corresponding to a head are additionally configured, wherein the head corresponds to a configuration element configuring the polishing device, and wherein calculation nodes are generated based on the equipment shape variables, the operation variables, and the calculation variables.

15. The device of claim 11, wherein equipment shape variables, operation variables, and calculation variables corresponding to a conditioner are additionally configured, wherein the conditioner corresponds to a configuration element configuring the polishing device, and
wherein calculation nodes are generated based on the equipment shape variables, the operation variables, and the calculation variables.

16. The device of claim 11, wherein at least one of an effective sliding distance and an accumulated movement vector is selected and further calculated, in addition to a sliding distance of a wafer surface caused by the pad or a sliding distance of a pad surface caused by the wafer.

* * * * *